United States Patent
Brown et al.

(10) Patent No.: US 10,557,902 B2
(45) Date of Patent: Feb. 11, 2020

(54) OPTIMIZED RF SHIELD DESIGN

(71) Applicant: Case Western Reserve University, Cleveland, OH (US)

(72) Inventors: Robert W. Brown, Cleveland, OH (US); Yong Wu, Cleveland, OH (US); Zhen Yao, Cleveland, OH (US); Shmaryu Shvartsman, Highland Heights, OH (US); Thomas Chmielewski, Stow, OH (US); Timothy Eagan, Cleveland Heights, OH (US)

(73) Assignee: Case Western Reserve University, Cleveland, OH (US)

( * ) Notice: Subject to any disclaimer, the term of this patent is extended or adjusted under 35 U.S.C. 154(b) by 1025 days.

(21) Appl. No.: 14/685,021

(22) Filed: Apr. 13, 2015

(65) Prior Publication Data

US 2015/0212174 A1    Jul. 30, 2015

Related U.S. Application Data

(62) Division of application No. 13/407,852, filed on Feb. 29, 2012, now Pat. No. 9,013,185.

(51) Int. Cl.
| | |
|---|---|
| *G01V 3/00* | (2006.01) |
| *G01R 33/422* | (2006.01) |
| *G01R 33/565* | (2006.01) |
| *G01R 33/341* | (2006.01) |
| *G01R 33/385* | (2006.01) |
| *G01R 33/48* | (2006.01) |

(52) U.S. Cl.
CPC ......... *G01R 33/422* (2013.01); *G01R 33/341* (2013.01); *G01R 33/385* (2013.01); *G01R 33/4822* (2013.01); *G01R 33/56518* (2013.01); *Y10T 83/505* (2015.04)

(58) Field of Classification Search
CPC .................................................. G01R 33/4215
USPC .................................................. 324/318, 322
See application file for complete search history.

(56) References Cited

U.S. PATENT DOCUMENTS

| | | | | |
|---|---|---|---|---|
| 4,642,569 | A | * | 2/1987 | Hayes .................... G01R 33/42 324/300 |
| 5,159,929 | A | | 11/1992 | Morris |
| 5,243,286 | A | * | 9/1993 | Rzedzian ........... G01R 33/3854 324/318 |

(Continued)

*Primary Examiner* — Louis M Arana
(74) *Attorney, Agent, or Firm* — Pillsbury Winthrop Shaw Pittman LLP

(57) ABSTRACT

Radio frequency (RF) shields used with magnetic resonance imaging (MRI) apparatus may experience gradient field induced eddy currents and RF field induced eddy currents. These eddy currents can cause the RF shield to heat up at an undesirable rate. RF shields are designed to have a desired degree of RF shielding and a desired heating attribute. Design goals for RF shields include gradient field transparency and RF field opacity, both of which can be influenced by eddy currents. Example methods identify a gradient field that will induce eddy currents and identify an RF field that will induce eddy currents. If a region on the RF shield is identified where the desired heating attribute will not be achieved, then a pattern of axial cuts and azimuthal cuts can be made in the RF shield to reduce gradient eddy current heating in the RF shield while maintaining desired RF shielding.

23 Claims, 20 Drawing Sheets

(56) References Cited

U.S. PATENT DOCUMENTS

| | | | | |
|---|---|---|---|---|
| 5,367,261 A | * | 11/1994 | Frederick | G01R 33/422 324/318 |
| 5,381,093 A | * | 1/1995 | Kawamoto | G01R 33/34046 324/318 |
| 5,592,087 A | * | 1/1997 | Richard | G01R 33/422 324/318 |
| 5,680,046 A | * | 10/1997 | Frederick | G01R 33/422 324/318 |
| 5,708,360 A | | 1/1998 | Yui | |
| 7,397,244 B2 | | 7/2008 | Cirel | |
| 8,903,504 B2 | | 12/2014 | Hegland | |
| 2015/0005616 A1 | | 1/2015 | Saha | |

* cited by examiner

OPTIMIZED RF SHIELD DESIGN

CROSS REFERENCE TO RELATED APPLICATIONS

This application is a divisional application of U.S. application Ser. No. 13/407,852, filed Feb. 29, 2012.

COPYRIGHT NOTICE

A portion of the disclosure of this patent document contains material that is subject to copyright protection. The copyright owner has no objection to the facsimile reproduction of the patent document or the patent disclosure as it appears in the Patent and Trademark Office patent file or records, but otherwise reserves all copyright rights whatsoever.

BACKGROUND

Magnetic resonance imaging (MRI) apparatus typically employ three gradient coils to produce spatially selective information encoding in a sample. The three gradient coils contain numerous turns of conductive wires and produce gradients that may be pulsed on and off. MRI apparatus also use radio frequency (RF) transmit coils to produce spin excitation in a sample. An RF shield may be placed between a set of RF transmit coils and the gradient coils to prevent the RF field produced by the RF transmit coils from interacting with the gradient coils.

An ideal RF shield would be completely transparent to the gradient field produced by the gradient coils and completely opaque to the RF field produced by the RF transmit coils. Being completely opaque (e.g., completely blocking the RF field from interacting with the gradient coils) is a design goal because an interaction between the RF coils and the gradient coils could produce an RF energy loss that would appear as a lowering of the quality factor Q of the RF coil and would decrease the signal-to-noise ratio (SNR) of signal received from the sample.

Two types of eddy currents may be produced in an RF shield interposed between gradient coils and RF transmit coils. The gradient coils may induce eddy currents in the RF shield and the RF transmission coils may also induce eddy currents in the RF shield. The eddy currents have different properties. RF shields are designed to disrupt the gradient coil induced eddy currents and to not disrupt the RF transmission coil induced eddy currents.

Conventional RF shields are made of a copper-dielectric-copper laminate structure with slits in both copper layers. The slits on the copper layers of the RF shield are designed to suppress gradient eddy current heating while still allowing the RF shield to reduce coupling between the RF and gradient systems. The slits need to be placed to reduce gradient eddy currents while still allowing a return path for RF eddy currents. Therefore, capacitors may be positioned to span a slit in the copper so that RF eddy currents have a return path and are not disrupted. The capacitors form a high-pass filter that allows the RF eddy currents to flow and thus shield the RF coil field. The capacitors also impede gradient eddy currents that might negatively impact the gradient field. Unfortunately, having too many slits and too many capacitors may produce undesirable results. The undesirable results may be produced in traditional RF shields that have hundreds of capacitors placed around multiple small cross-cuts with both axial and azimuthal directions.

The undesirable results include, for example, capacitors being impacted by ohmic heating. Ohmic heating may affect capacitor lifetimes, capacitor failure rates, and melting of soldered bases. As temperatures increase in hybrid systems using split coils, ohmic heating issues with capacitors may also increase. Therefore reducing the numbers of slits and thus the number of capacitors may produce improved results. Additionally, cutting slits in the copper sheets introduces holes through which RF energy can pass. Having RF energy pass through the RF shield makes the RF shield less opaque to the RF field and allows conditions where there could be an interaction between the RF system and the gradient system.

One conventional RF shield includes slits that follow RF current streamlines on the RF shield. While this conventional shield may be appropriate for some applications, it may not be appropriate for circular or "quadrature" excitation where the RF current streamline rotates with the Larmor frequency over the RF shield. As the current streamline rotates with the Larmor frequency it may pass over slits that are fixed in space and thereby allow RF leakage.

Eddy currents that are induced in an RF shield due to the pulsing gradient field can reduce penetration of the gradient field into the imaging volume and may give rise to ohmic heating in the RF shield. This heating in the RF shield may be more pronounced for some rapid imaging techniques (e.g. echo planar imaging (EPI)) and for hybrid MRI systems configured with split gradient coil designs.

MRI-guided hybrid systems are becoming more important due to advantages they provide over traditional MRI systems. In some MRI-guided hybrid systems, the MRI scanner is split into two halves in order to accommodate complementary diagnostic and therapeutic equipment for performing radiotherapy, positron emission tomography (PET), surgery (e.g., ablation), and other applications. In addition to the gap in the MRI main magnet, the X, Y and Z gradient coils may be split.

Gradient coil patterns for hybrid systems may be bunched more closely near gaps in the split coils. FIGS. 1 and 2 illustrate the bunching of gradient coil wires near the gap forming the split between portions of the gradient coil. The closer bunching of gradient coil patterns may exacerbate heating because of stronger local magnetic fields near the denser collection of gradient coil wires. FIG. 1 illustrates a split transverse gradient coil 100. Coil 100 is separated from RF transmit coils 110 by an RF shield 120. Note the different density of coil wires in regions 112 and 114 of coil 110. FIG. 2 illustrates a split longitudinal gradient coil 200. Coil 200 is separated from RF transmit coils 210 by an RF shield 220. Note the different density of coil wires in regions 212 and 214 of coil 210. The higher density of coil wires in regions 114 (FIG. 1) and 214 (FIG. 2) produce stronger local fields that can increase ohmic heating in specific regions on an RF shield. The ohmic heating is produced by oscillating eddy currents produced by rapid pulses in the gradient coils. The concentration of coil wires in regions 114 (FIG. 1) and 214 (FIG. 2) may concentrate ohmic heating. Thus, the issue of ohmic heating may be exacerbated on RF shields used in split geometries as compared to non-split geometries.

BRIEF DESCRIPTION OF THE DRAWINGS

The accompanying drawings, which are incorporated in and constitute a part of the specification, illustrate various example systems, methods, and other example embodiments of various aspects of the invention. It will be appreciated that the illustrated element boundaries (e.g., boxes, groups of boxes, or other shapes) in the figures represent one example of the boundaries. One of ordinary skill in the art will appreciate that in some examples one element may be designed as multiple elements or that multiple elements may be designed as one element. In some examples, an element shown as an internal component of another element may be implemented as an external component and vice versa. Furthermore, elements may not be drawn to scale.

DETAILED DESCRIPTION

Example apparatus and methods design and/or produce a radio frequency (RF) shield for use in magnetic resonance imaging (MRI) systems. In one embodiment, an RF shield may be a portion of a hollow cylinder fabricated with one or more sheets of shaped and slotted copper connected by a dielectric material. In one example, the shield may be fashioned on a printed circuit board and thus slits may be cut all the way across a copper sheet. The RF shield is configured to be positioned between a set of gradient coils in an MRI system and a set of RF transmit coils. Slots may be cut on the copper on each surface of the shield to disrupt gradient eddy currents induced on the RF shield and thereby reduce ohmic heating. Capacitors may be added as bridges over the slots to mitigate issues associated with disrupting the high-frequency RF eddy currents induced on the RF shield. Cutting slots and using thin sheets of copper facilitates suppressing gradient eddy current heating. While conventional axial slot patterns have provided some heating suppression, hybrid MRI systems may require an improved design of both axial and azimuthal slots to achieve adequate heating attributes in for RF shields in hybrid MRI systems.

Therefore, in one embodiment, example apparatus and methods optimize slit patterns for RF shields for use in hybrid MRI systems. In one example, optimal slit patterns maximize gradient penetration through the RF shield and minimize RF penetration through the RF shield while maintaining desired temperature performance on the RF shield. Gradient eddy currents are effectively reduced by restricting the lengths of the axial slits in a central region of the RF shield and then by placing a small number of azimuthal slits centered on "cold" bands outside of the central region of the RF shield.

Figure 1:
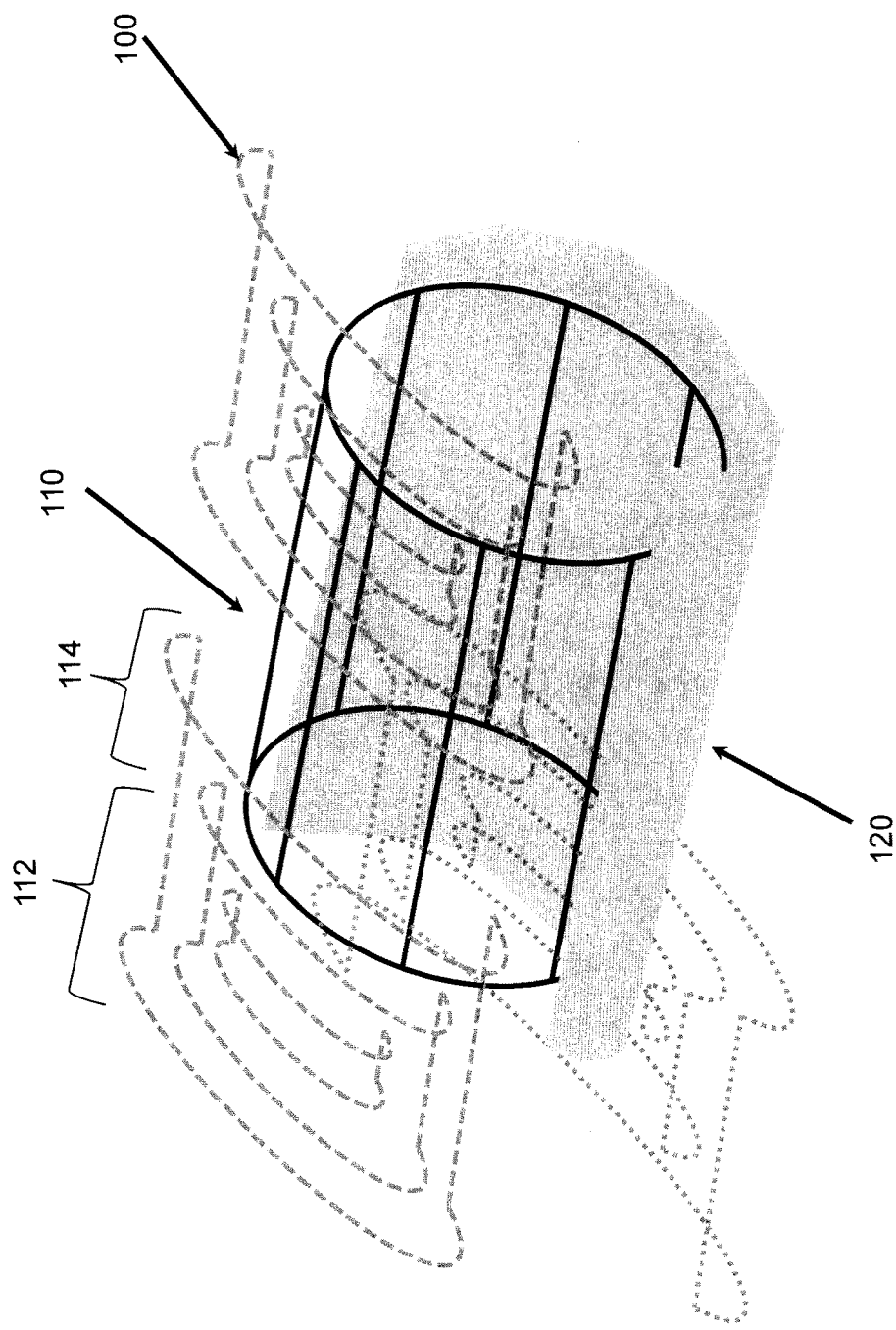
FIG. 1 is a schematic perspective view of a split transverse gradient coil separated from an RF birdcage body coil by an RF shield.
Figure 2:
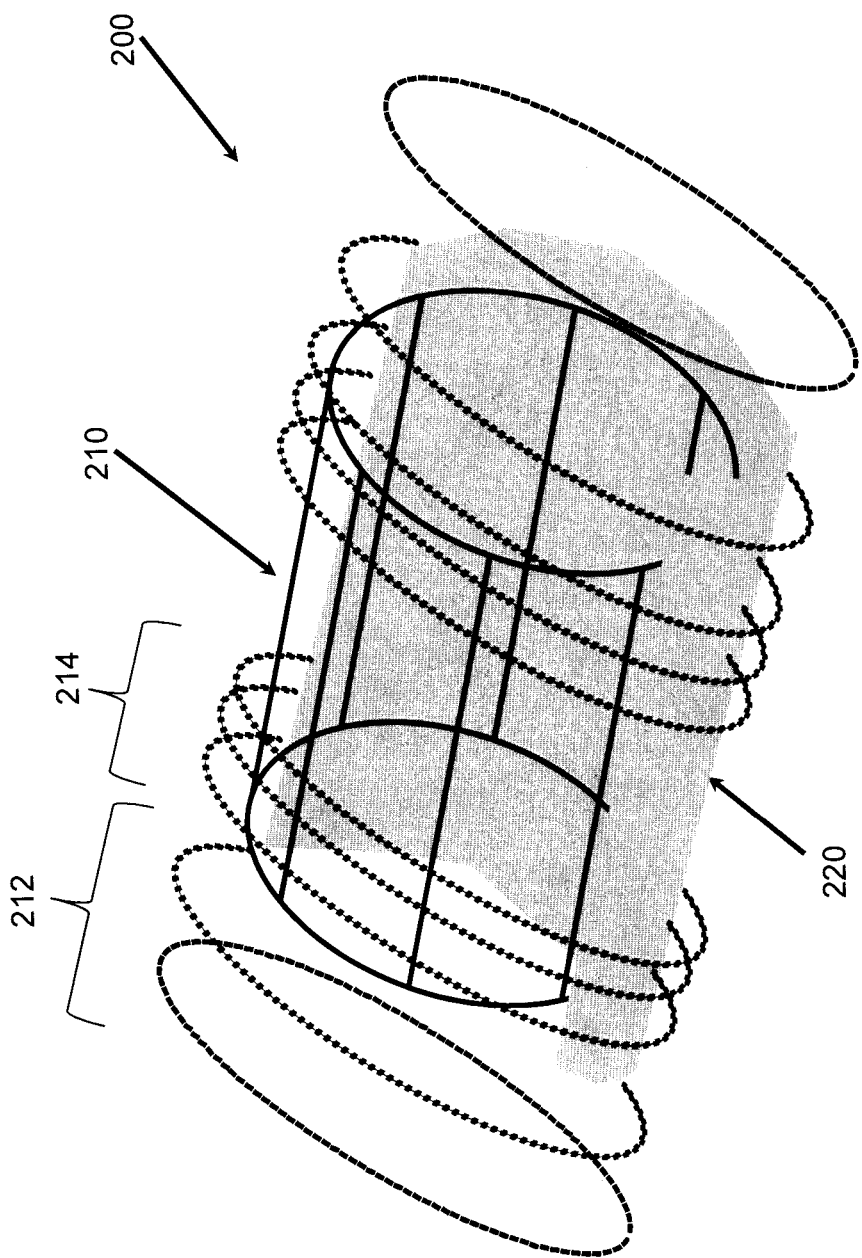
FIG. 2 is a schematic perspective view of a split longitudinal gradient coil separated from an RF birdcage body coil by an RF shield.

FIGS. 1 and 2 illustrate how an RF shield may be positioned between a gradient coil and an RF body coil. The RF shield and RF body coil may both be positioned within the bore of an MRI system. RF shields have been used to separate gradient coils and RF coils for years. However, new types of MRI apparatus (e.g., split systems) and new types of MRI operations (e.g., quadrature) have been introduced.

Thus, in one embodiment, example apparatus and methods produce an RF shield that suppresses gradient induced eddy current heating using a minimal number of slits on the RF shield. Reducing the number of slits may also facilitate reducing the number of capacitors. In one embodiment, placement of the slits is based, at least in part, on numerical simulations. While a general combination of axial and azimuthal incisions on an RF shield to suppress the gradient eddy current heating has been described, the axial pattern was considered collectively with the azimuthal pattern rather than performing separate analysis and design for the axial slits and the azimuthal slits. Thus, example apparatus and methods may perform a multi-part iterative analysis that considers axial slits and azimuthal slits separately to provide improved heat suppression. Fingerprint-like incision patterns calculated to follow RF eddy current flow have provided some suppression in linearly polarized RF transmission but have not been applicable to quadrature operation. Thus, example apparatus and methods may size and position slots based, at least in part, on quadrature operation considerations.

Figure 3:
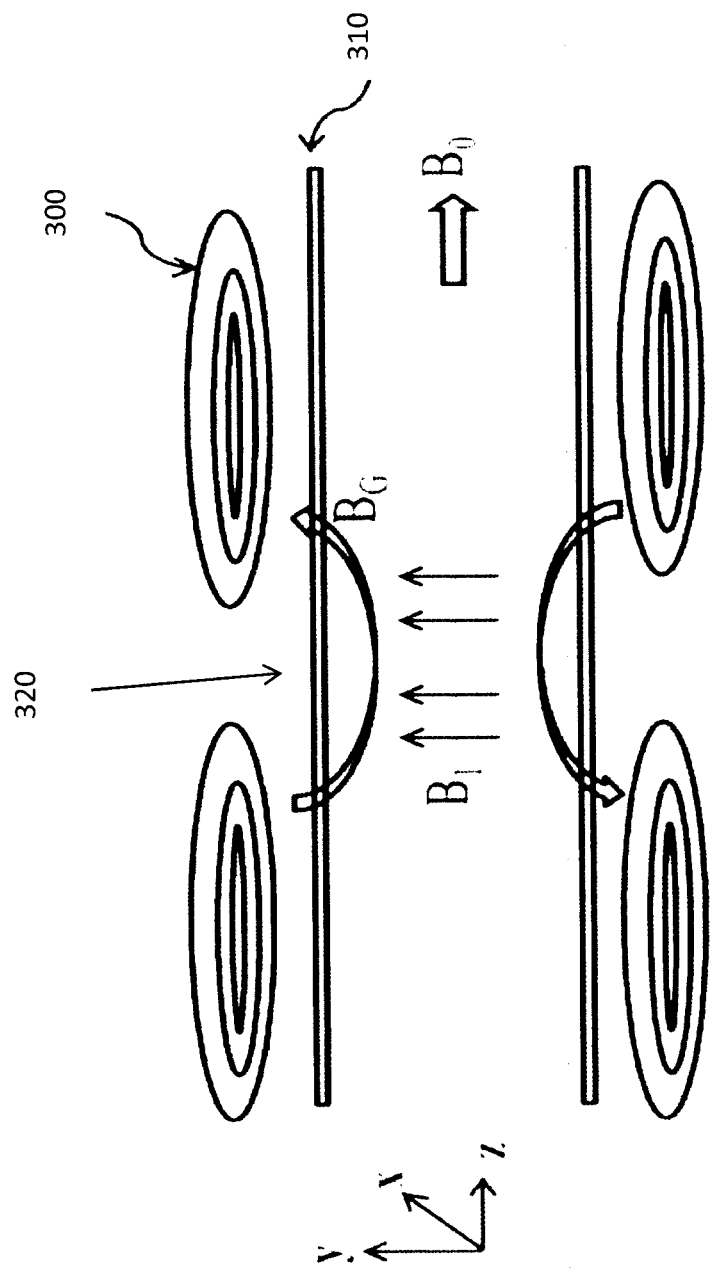
FIG. 3 is a section view illustrating field lines corresponding to a main magnet field $B_0$, an RF field $B_1$ produced by a body coil, and a Y-gradient field $B_G$.

FIG. 3 illustrates a field B0 produced by the main magnet in an MRI system. This field B0 is produced along the Z-axis. The homogeneity of the field is on the level of several parts per million (ppm) in the region of interest. Three sets of gradient coils (Gx, Gy, Gz) provide linearly spatially dependent Z-components of their fields. Gradient coil 300 is illustrated producing a gradient field that is normal to the surface of RF shield 310 in the "gap" region 320 where the gradient coil 300 is split. Gradient coils like split gradient coil 300 may produce gradients using pulses that produce pulsating magnetic flux. Pulsating magnetic flux may induce an electric current that circulates around the RF shield 310 in the general pattern of an image current. Pulsating magnetic flux may lead to ohmic heating of the RF shield 310, and, in some cases, that heating may reach an undesirable or unacceptable level. Conventional shields addressed ohmic heating by introducing axial slits into an RF shield. However, shields to be used in hybrid MRI systems may require an improved design.

Figure 4:
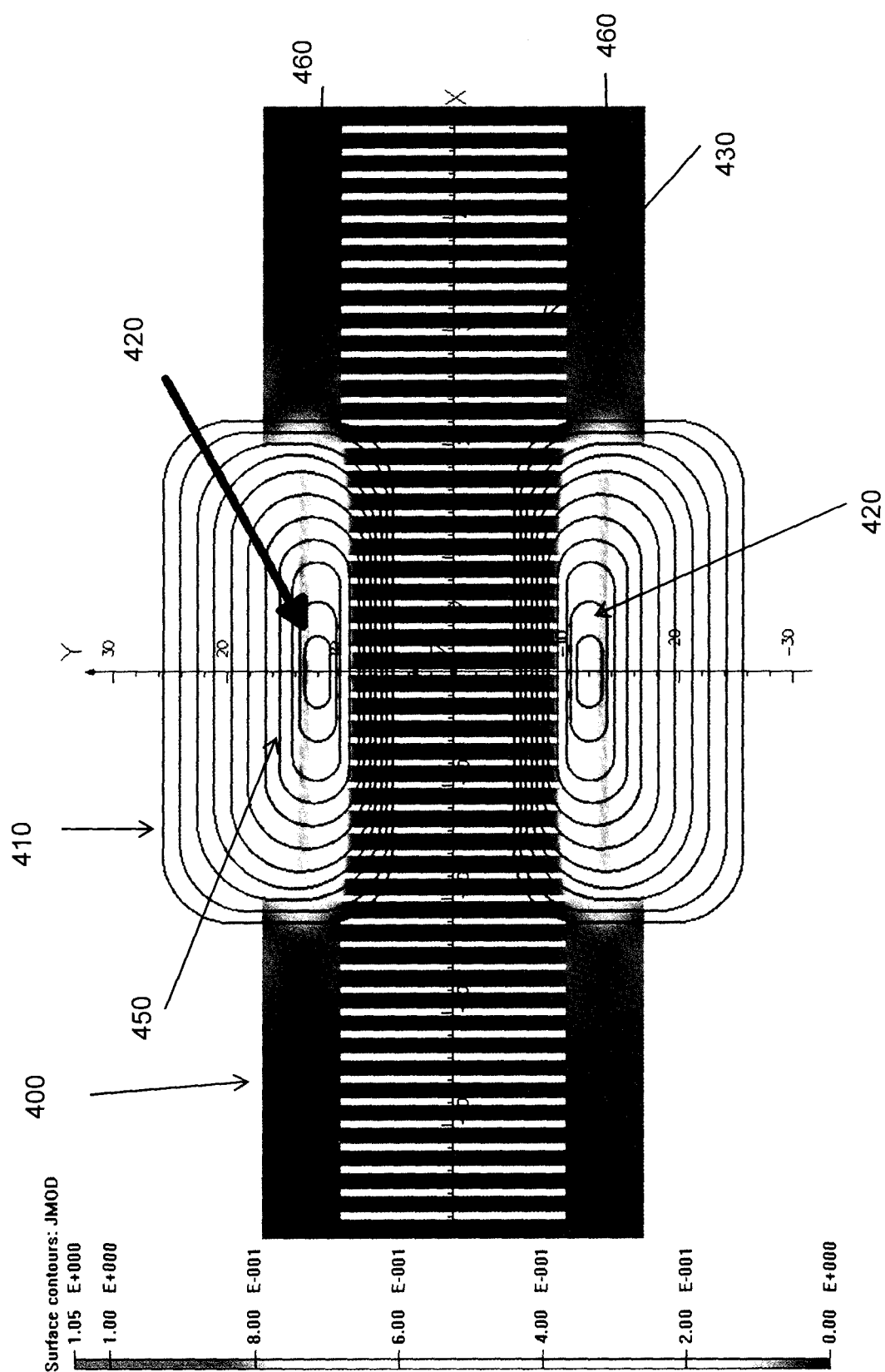
FIG. 4 illustrates a simulation result for eddy current density over a traditional RF shield with a plurality of axial slits and no azimuthal slits.

FIG. 4 illustrates an RF shield 400 that includes a conventional pattern of axial slits 430. FIG. 4 illustrates gradient coil 410 as two mirror-image gradient fingerprints. The gradient coil 410 and RF shield 400 are illustrated as an unrolled planar sheet.

Current flowing through the gradient coil 410 will induce eddy currents on RF shield 400. The relative strengths of the eddy currents are illustrated through gray scale shading where stronger eddy currents are lighter and weaker eddy currents are darker. In one example, eddy current densities for the RF shield 400 may be computed by solving the electromagnetic Maxwell equations associated with the gradient currents and the planar sheet. Solving the Maxwell equations may reveal a "cold" (e.g., dark) region 420 where there is minimal eddy current ohmic power. Solving the Maxwell equations may also reveal a "hot" (e.g., white) region 450 where there is maximal eddy current ohmic power. The high eddy current ohmic power may be localized in the end ring region 460 of a conventional RF shield 400. Example apparatus and methods facilitate adding 360-degree azimuthal slits to the end ring region 460 to produce an improved RF shield with more effectively suppressed eddy current heating. In one embodiment, the position(s) of the azimuthal slit(s) in the end ring region 460 can be determined based, at least in part, on an electromagnetic analysis that details the effectiveness of an azimuthal cut pattern in suppressing ohmic heating.

Figure 5:
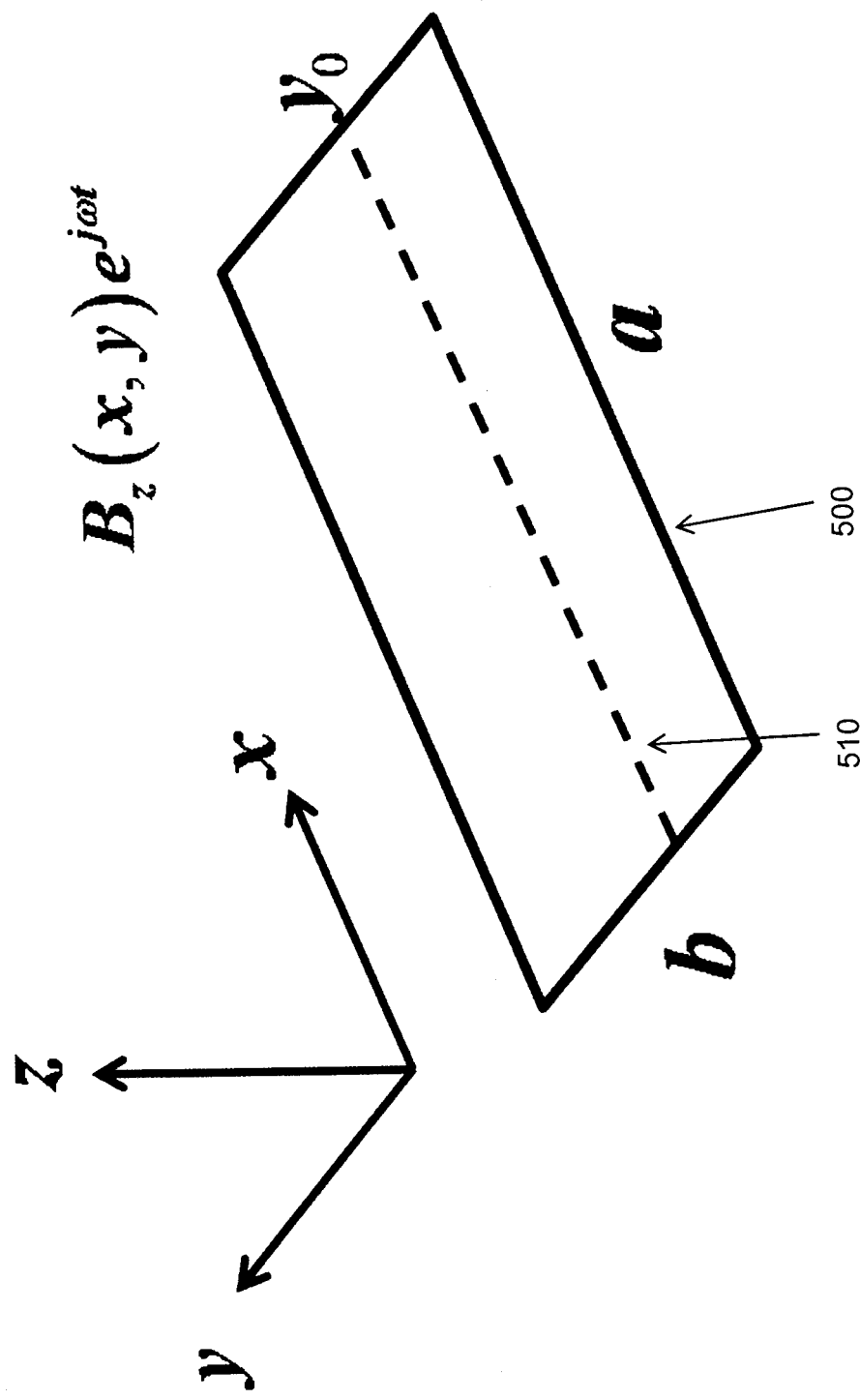
FIG. 5 illustrates a rectangular portion of an RF shield having a long edge a and a short edge b.

FIG. 5 illustrates a planar rectangular copper strip 500 with dimensions a and b (a>b). The copper strip 500 may be subjected to a field with a component normal to the strip 500. The dashed line 510 represents the position of a slit at $y=y_0$ parallel to the x-axis. Theoretical analysis and experimental results reveal that the area on a copper strip in an RF shield that receives the largest normal flux will experience the greatest ohmic heating.

An estimate of the electric field induced on the copper due to the pulsing gradient can be computed using Faraday's law in electrodynamics. If E is the magnitude of the average circulating electric field around the edge of the copper strip, $\omega$ is the angular frequency (frequency of oscillation) and B is the peak magnitude of the normal magnetic field, then the voltage drop around the edge is related to the magnetic flux through the strip by:

$$E \cong \frac{\omega B a b}{2(a+b)}$$

For the case where a>>b, then E would be dominantly determined by its proportionality to the short edge according to:

$$E \cong \frac{1}{2}\omega B b$$

If a single cut is made parallel to the short edge (b) across the center of the strip, and if a/2 is still much larger than b, E will remain approximately dominated by the short-edge factor b. Thus the ohmic power density $\sigma E^2$, for electrical conductivity $\sigma$, is also dominated by b. If, on the other hand, a cut is made parallel to the long edge (a), and again across the center of the strip, the factor b, and the electric field, are halved as described by:

$$E \cong \frac{1}{2}\omega B \frac{b}{2}$$

Halving the electric field creates a condition where the eddy current power loss becomes approximately one fourth of that in a similar copper strip that has no cuts or that has a single center cut parallel to the short edge.

Example apparatus and methods may therefore determine where to place axial and azimuthal slits based, at least in part, on understanding power losses for various conducting two-dimensional shapes. For a rectangular shape with sides a and b, an estimate for the total, time-averaged, power loss due to a uniformly normal magnetic field $B_0$ oscillating at frequency $\omega$ is found to be:

$$\langle P \rangle \approx 0.035\omega^2 \beta_0^2 \sigma d \frac{a^3 b^3}{a^2+b^2} \quad [1]$$

According to Equation [1], the average power volume density over the strip is approximately proportional to:

$$P \propto \frac{a^2 b^2}{a^2+b^2} \quad [2]$$

If a>>b, the long edge a will be cancelled out in both the denominator and numerator, and the average power will be approximately proportional to, and dominated by, the short edge b. Placing an azimuthal cut halves the short edge. Halving the short edge reduces the average power density to ¼ of what it was without the azimuthal slit.

Figure 9:
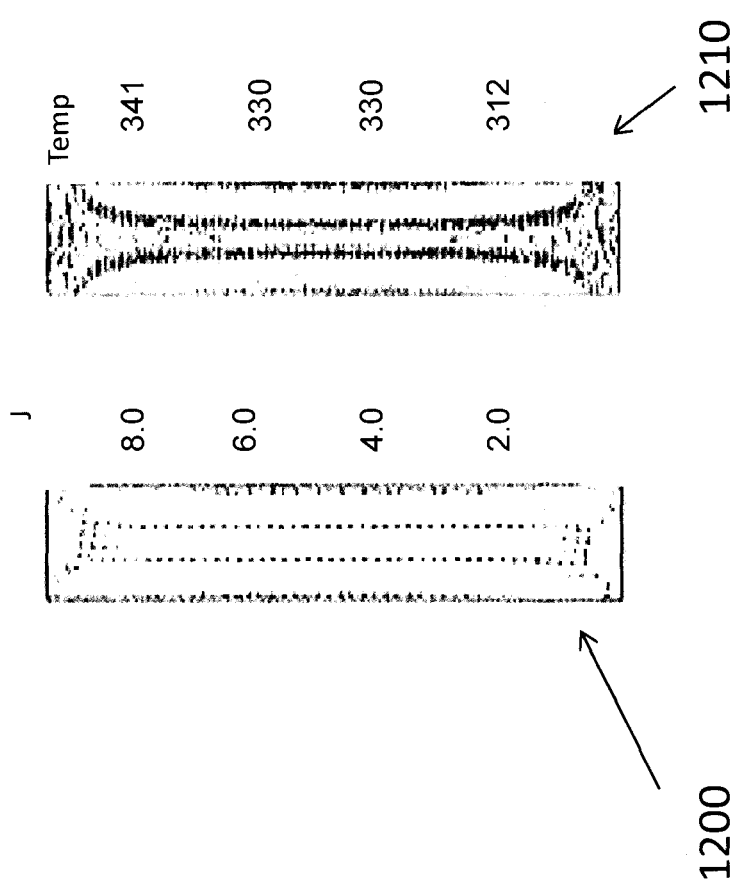
FIG. 9 illustrates a correlation between eddy current distribution and temperature distribution.

For a spatially non-uniform field, it may be more involved to determine where to place a cut. As a special case for a non-uniform field, consider a magnetic field with a linear y-gradient in its z-component, $B_z(x,y)=B_0+G\cdot y$, impressed upon a copper strip. A cut parallel to the long edge of the strip will divide the strip into two parts. If the eddy current power loss for each part is represented by <$P_1$> and <$P_2$>, and if <P> represents the power loss without any cuts, the curves pertaining to the power loss ratio (<$P_1$>+<$P_2$>)/<P> for different cut positions (different slit positions $y_0$) are shown in FIG. 9. As will be shown later, optimal cut positions correspond to the locations where the power curves reach their minima.

Figure 6:
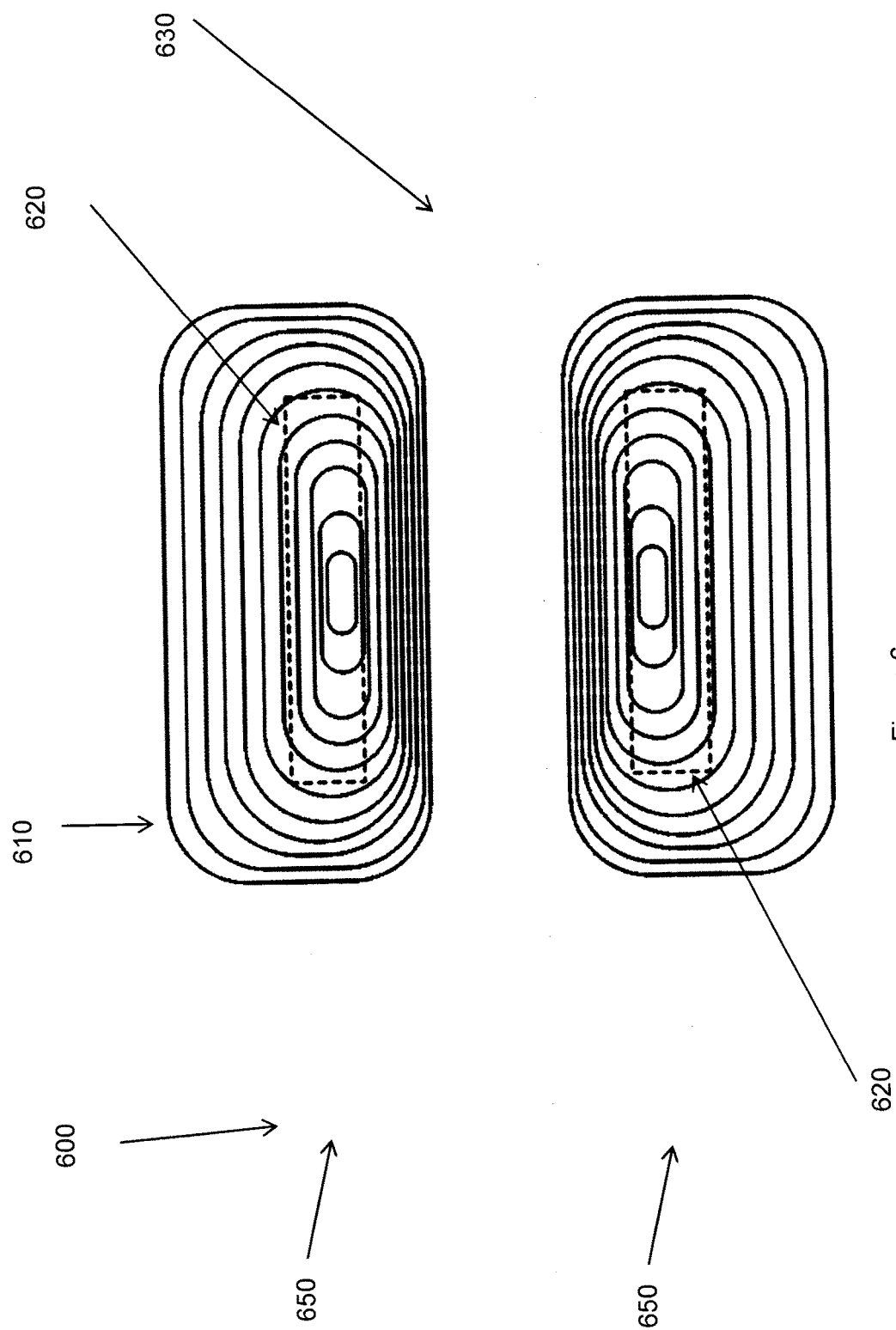
FIG. 6 is a planar (rolled-out) view of an RF shield that includes both azimuthal slits and axial slits.

FIG. 6 illustrates a flattened view of one half of an X-gradient coil 610 for a split MRI system. X gradient coil 610 is positioned over an example cylindrical RF shield 600. The X-gradient coil 610 and the RF shield 600 are shown unwrapped and with axial slits 630 and azimuthal slits 650. The dashed lines identify the dominant heating regions 620 produced by gradient eddy currents. A Y-gradient coil pattern and heating area may be found by shifting the X-gradient coil 610 pattern by an amount corresponding to 90 azimuthal degrees. Example apparatus and methods may identify the dominant heating regions 620 and place the azimuthal slits 650 based, at least in part on the identification of the dominant heating regions 620.

Figure 7:
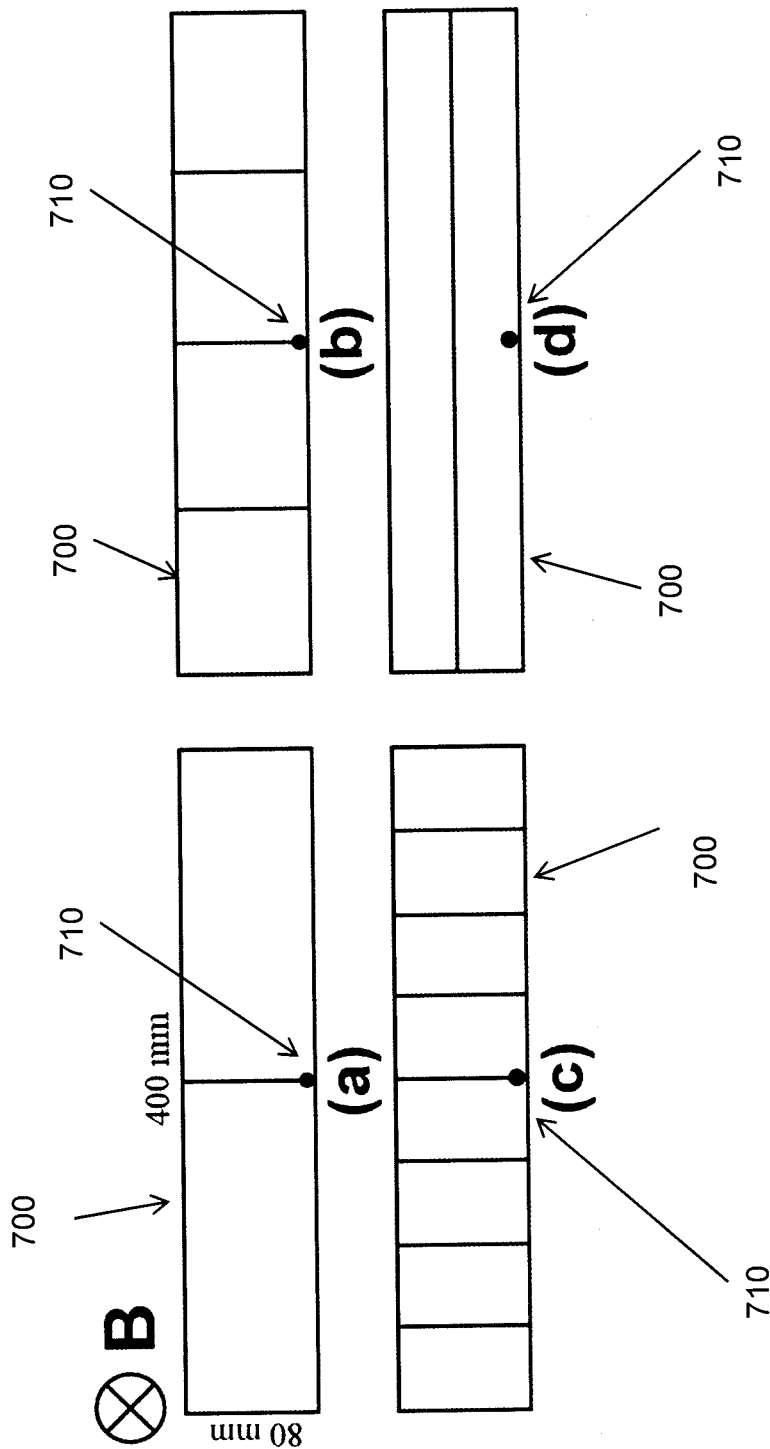
FIG. 7 illustrates four slit patterns in a copper strip.

FIG. 7 illustrates one pattern of axial and azimuthal cuts in a copper strip. Four classes of incisions (a), (b), (c), and (d) were made on the strip 700. Temperature was measured at the position indicated by the black dot 710. Strip length a=400 mm and width b=80 mm are indicated.

Experimental results reveal heat suppression produced by azimuthal cuts in example RF shields produced by example methods and apparatus described herein. In one experiment, a rectangular copper strip similar to strip 700 with dimensions 400 mm×80 mm×0.03 mm was placed under a gradient coil. The copper strip was positioned under the fingerprint eye of a split gradient coil so that an azimuthal cut in the copper strip would bisect the copper strip along its long axis. Gradient current flowing in the gradient coil was pulsed at 1500 Hz. Experiments were performed with 1 axial cut, 3 axial cuts, 7 axial cuts, and 1 azimuthal cut as illustrated in FIG. 7. An optical thermometer was used to monitor the temperature evolution as a function of time. In one experiment, temperature was monitored at a single mid-point on the copper strip. In another experiment, current was allowed to flow and temperature increases were measured over time.

Figure 8:
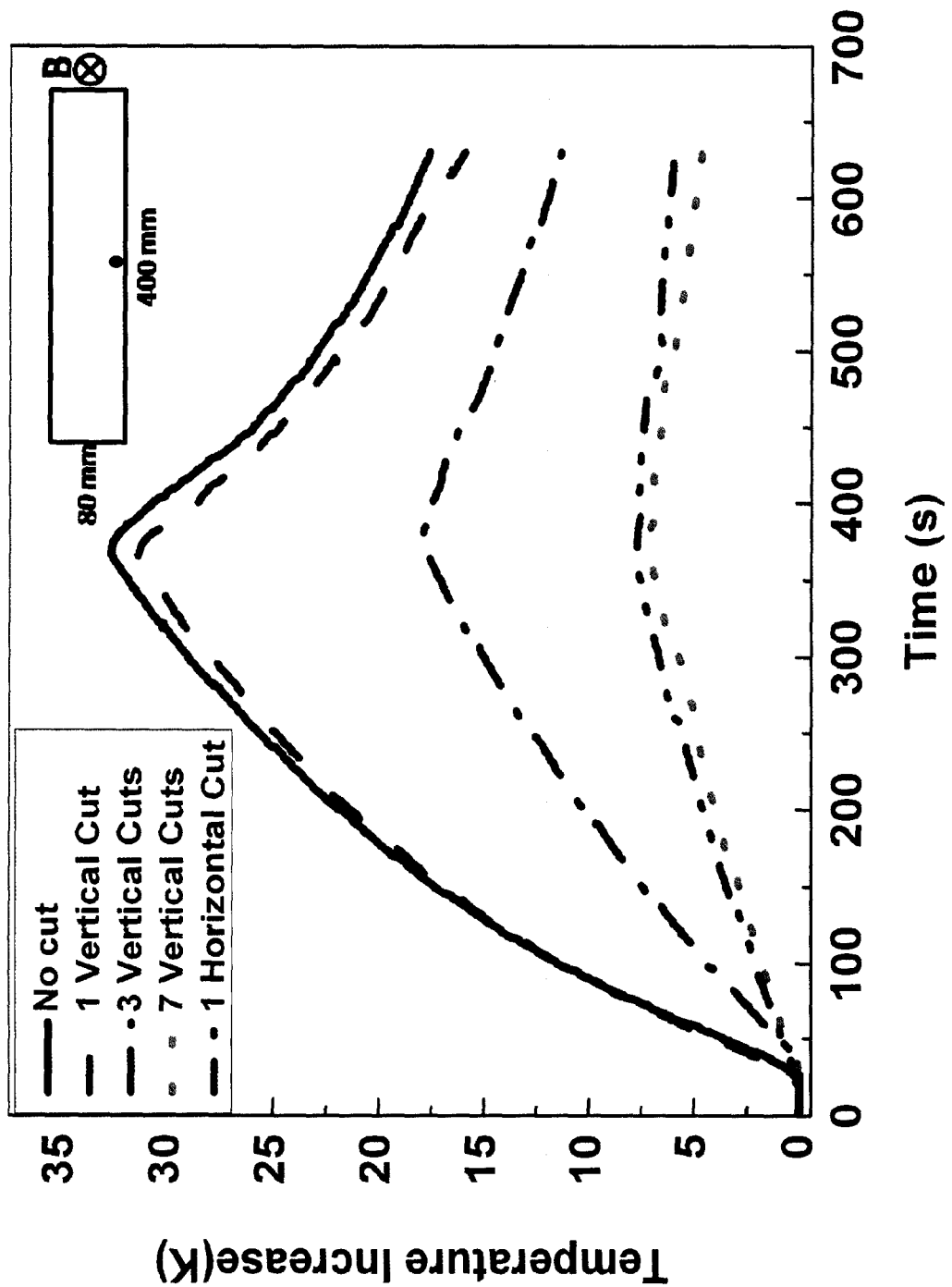
FIG. 8 illustrates experimental results tracking temperature increases in a copper strip.

Example results are illustrated in FIG. 8. FIG. 8 illustrates temperature curves for four cut patterns. FIG. 8 illustrates that, as expected, a single axial cut across the copper strip resulted in only a minor decrease in the peak temperature. FIG. 8 also illustrates that, as expected, a single azimuthal cut reduced the temperature peak by a factor of approximately ¼ (7.5 K relative to 32 K). This measured result agrees well with the analytical result that the electric field should be half, the power loss should be 25% relative to a strip with no cuts, and that the temperature peak should also be 25% of the temperature peak of the strip with cuts. This correlation between analytical results and observed results informs two different embodiments of a method for identifying cut patterns. In one embodiment, cut patterns can be determined analytically. In another embodiment, cut patterns can be determined by actually making cuts and observing results. In either embodiment, cuts can be designed or fabricated iteratively until a desired temperature attribute is achieved while maintaining desired RF shielding properties.

Table 1 compares temperature measurements, 2D analytical results, and 3D numerical simulations for the temperature curves illustrated in FIG. 8.

TABLE 1

| Numbers and kinds of cuts | Peak Temperature increases (measured) | Measured ratios normalized to zero cuts | 2D power ratios calculated by Eq. [2] | 3D power simulations for the ratios |
|---|---|---|---|---|
| 0 | 32.7 K | 1 | 1 | 1 |
| 1 cut parallel to the short dimension | 31.4 K | 0.96 | 0.90 | 0.95 |
| 3 cuts parallel to the short dimension | 17.9 K | 0.55 | 0.63 | 0.56 |
| 7 cuts parallel to the short dimension | 7.2 K | 0.22 | 0.29 | 0.235 |
| 1 cuts parallel to the long dimension | 7.8 K | 0.24 | 0.26 | 0.26 |

Example apparatus and methods may use formulae that describe eddy current power loss to determine where to position slots that will reduce ohmic heating. In one embodiment, slot position can be determined based on eddy current simulations due to the theoretical and observed correlation between eddy current power loss and temperature. FIG. 9 illustrates a correlation between temperature distribution 1210 on an RF shield and eddy current distribution 1200 on the RF shield. In general, a heat equation may be employed to connect the eddy current heating to the temperature of the copper strip for purposes of identifying slot locations. For an experimental copper strip, the temperature T obeys a thermal diffusion equation:

$$\rho c \frac{\partial T(x, y)}{\partial t} = k\nabla^2 T(x, y) + J^2(x, y)/\sigma - hT(x, y)/d \quad [3]$$

Here, T is the shield temperature relative to a fixed ambient temperature. ρ, c, k, σ, J and h are the mass density, specific heat, thermal conductivity, electrical conductivity, eddy current density (A/m$^2$) and total heat transfer (surface) coefficient, respectively. Equation [3] illustrates that the temperature time-rate of change is determined by a combination of spatial-diffusion, eddy current heating, and cooling terms. Equation [3] can be solved by 2D finite element methods. However, in one embodiment, example apparatus and methods may not consider the spatial diffusion term and may focus on the relationship between temperature and ohmic power. In this case Equation [3] will become a first-order differential equation, and the solution for a given position x, y, is found to be:

$$T = \frac{J^2 d}{\sigma h}\left(1 - \exp\left(-\frac{ht}{cd\rho}\right)\right) \quad [4]$$

Equations [2, 4] provide the relation between the temperature and the dimensions of the strip by:

$$T \propto J^2 \propto P \propto a^2 + b^2) \quad [5]$$

The proportionality relation between the temperature and the eddy current power loss in equation [5] implies that making cuts to reduce power loss will directly carry over to temperature suppression. Since equation [4] shows proportionality to the thickness d of the strip, in one embodiment, example apparatus and methods use thin material for an RF shield.

Based on the analytical and experimental results, example methods and apparatus may configure axial slits to suppress gradient induced eddy currents in a central region of an RF shield and may also configure azimuthal slits to suppress gradient induced currents in an outer region of an RF shield. The axial slits and the azimuthal slits are configured to not disrupt RF induced eddy currents. Since the RF induced eddy currents in the RF shield by the RF transmit coil flow axially in the center region of the RF shield, the axial slits will not block the RF current. Leaving the RF current unblocked facilitates maintaining RF shielding while allowing the gradient field produced by the gradient coil to penetrate the RF shield and reach the imaging volume. Suppressing gradient induced eddy currents suppresses heating.

Figure 10:
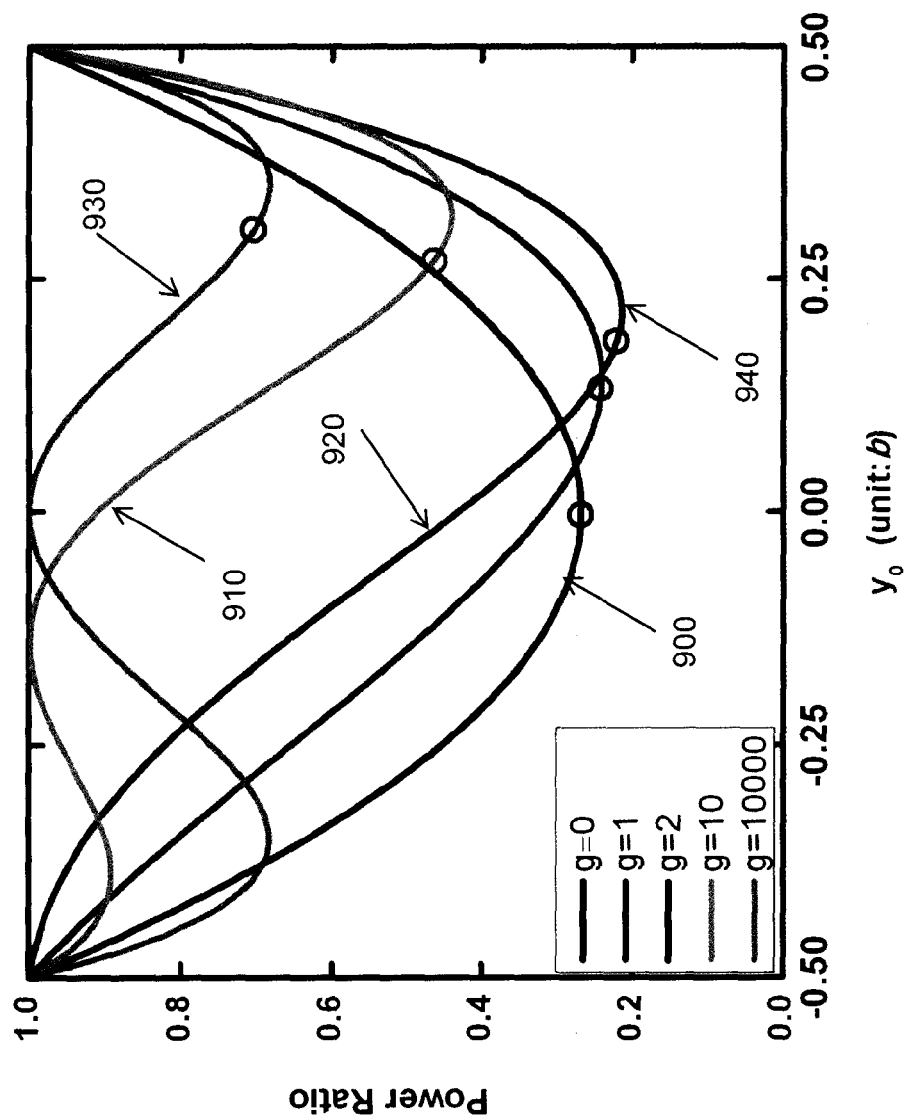
FIG. 10 illustrates a simulation result for eddy current density over an RF shield with greater length in the Z direction.

One approach for identifying slit locations involves analyzing a simulation result of power ratio versus the slit position y$_0$ (unit: b) for a copper strip. FIG. 10 illustrates the results of one experiment where a copper strip with an aspect ratio a/b=5 was placed under a magnetic field with different strength of gradient g=G·b/2B$_0$. Circles on the curves indicate where the electric field vanishes when no cuts are present. The locations where the electric field vanishes are called a "cold" region. Example apparatus and methods may place azimuthal cuts based on the locations of the cold regions.

In FIG. 10, curve 900 corresponds to the homogeneous case (g=0) where the optimal cut position is found at the center where the power loss has been reduced to 25% of the original loss. For inhomogeneous fields (curves 910, 920, 930, 940), the optimal cut position deviates from the center of the curve. However the "cold" regions where the electric field vanishes are fairly close to the optimal cut positions identified by the minimum for each of curves 910, 920, 930, and 940. Thus, in one embodiment, example apparatus and methods achieve eddy current power suppression and thus ohmic heating suppression by identifying "cold" bands where the electric field is close to a minimum. Numerical simulations can be employed to find the "cold" lines for the narrow strip region. Example apparatus and methods may then position azimuthal slits along these "cold" lines.

Figure 11:
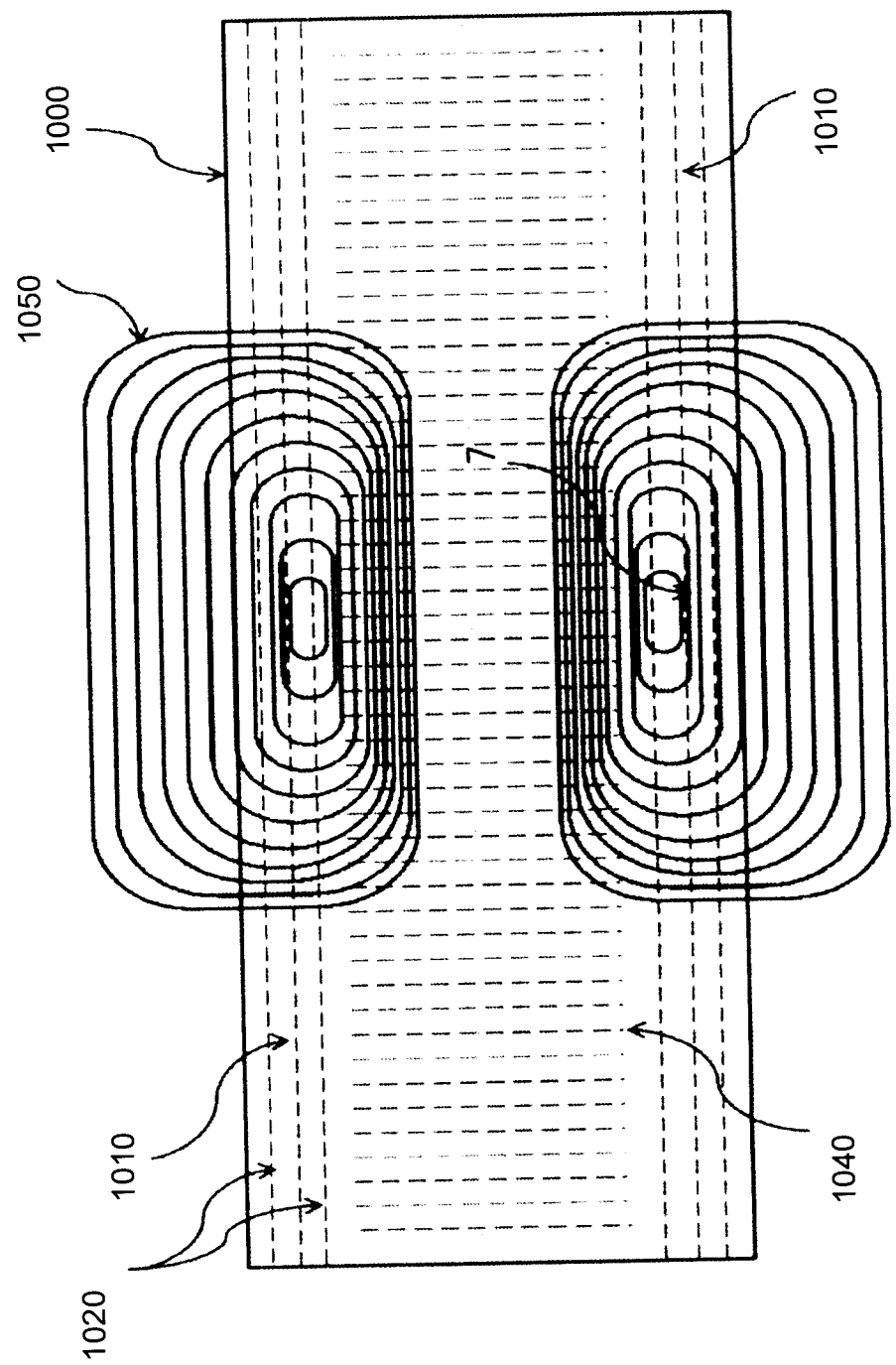
FIG. 11 illustrates a planar (rolled-out) view of an RF shield that includes both azimuthal slits and axial slits.

Turning now to FIG. 11, in one analysis, an eddy current ohmic loss in RF shield 1000 was normalized to 1.000 in arbitrary units. RF shield 1000 includes central axial cuts 1040. RF shield 1000 was subjected to a field produced by split gradient coil 1050. The pair of azimuthal slits 1010 suppressed the heating of RF shield 1000 down to 0.211 arbitrary units. This represents a 79% reduction in heating.

In one experiment, after the pair of azimuthal slits 1010 were produced, the RF shield 1000 was further analyzed. The analysis revealed that two heating bands remained. Therefore two more pairs of azimuthal slits 1020 were placed parallel to the two "cold" centers of the bands. Adding these additional azimuthal slits 1020 to the RF shield 1000 produced additional suppression. Experimental results showed that ohmic power loss was reduced to 0.0424. This represents a 96% eddy current suppression, which corresponded to a 96% heating reduction. Therefore example apparatus and methods may employ an iterative approach where cuts are placed and heating analysis, either theoretical or observed, is repeated until a termination condition is met.

Different RF shields will have different shapes and sizes. Additionally, different MRI systems will have gradient coils with different sizes and shapes. Hybrid MRI systems may have split gradient coils. Thus hybrid MRI systems may have a gap in both the main magnet and the gradient coils. Different hybrid systems may have different gaps between the portions of the main magnet or gradient coils. Therefore example methods can be configured to determine the position of a minimum eddy current region and then to position the axial cuts and azimuthal cuts based, at least in part, on the location of the minimum eddy current region. The position of a minimum eddy current region may depend on the size of the RF shield and the relative position of the RF shield and gradient coil wires.

Unlike conventional systems, example apparatus and methods may seek to improve or even optimize both axial and azimuthal slots. A traditional RF shield has a plurality of axial cuts in its central region. Example apparatus and methods may find a common length of these axial slots. By way of illustration, a birdcage coil can be approximated by an RF conducting cylinder that assumes the current density is continuously distributed instead of flowing along discrete rungs. Using this assumption, the induced RF eddy current density on a "long" shield can be found in terms of a stream function according to:

$$J_\phi(\phi, z) = \frac{\partial}{\partial z} S(\phi, z); \quad [6]$$

$$J_z(\phi, z) = -\frac{1}{R_s} \frac{\partial}{\partial \phi} S(\phi, z)$$

where the stream function for a long continuous cylindrical shield is given by:

$$S(\phi, z) = \int_0^\infty A(k) \frac{R_c I_1'(kR_c)}{R_s I_1'(kR_s)} \sin\phi \cos(kz) dk \quad [7]$$

with $$A(k) = \frac{2I(\cos(kZ_1) - \cos(kZ_2))}{\pi k^2 (Z_2 - Z_1)} \quad [8]$$

Here, I is the maximum current in an end ring chosen to be an azimuthal strip similar to an actual birdcage coil where the axial currents are assumed to be returned. While a birdcage coil is described, example apparatus and methods may be configured to determine slots for RF shields that will be placed between gradient coils and other types of RF transmit coils. $I_1$ is the first order modified Bessel function. $Z_1$ and $Z_2$ are defined to be the positive lengths from the axial center of coils at z=0 to the center of the end ring strip. $R_c$ and $R_s$ are the respective radii of the cylinder approximating the birdcage and the RF shield. In quadrature operation, the currents corresponding to Equations [6] and [7] rotate with Larmor frequency around the z-axis. In one embodiment that seeks to optimize slot placement, example apparatus and methods seek the domain $[+Z_c, +Z_c]$ where the axial component RF induced current density is dominant:

$$\int_0^\pi |J_z(\phi,z)| d\phi > \int_0^\pi |J_\phi(\phi,z)| d\phi \text{ for } z \in [-Z_c, +Z_c] \quad [9]$$

Example apparatus and methods then restrict axial slots to lie within the axial component dominant region defined by the inequality in Equation [9]. This step is configured to minimize the width of the end-ring azimuthal strip without impeding the azimuthal RF induced current return on the shield.

Example apparatus and methods may find a pattern of axial cuts to be used as the starting point for the azimuthal cut determination. This multi-step approach may be employed to achieve minimum ohmic heating for the combined set of azimuthal and axial cuts. Recall that axial cuts cannot extend so far that RF eddy currents on the shield induced by the RF transmit coil have no return path.

Example apparatus and methods may use Equations [6]-[8] to compute the RF eddy currents induced by an RF transmit coil onto a solid copper shield with no cuts. Shields of different length may be analyzed. In one simulation, the parameters of Equations [7, 8] were set to $R_c$=30 cm, $R_s$=32 cm, $Z_1$=25 cm, $Z_2$=26 cm, and the maximum current in the end ring was normalized to unity.

Figure 13:
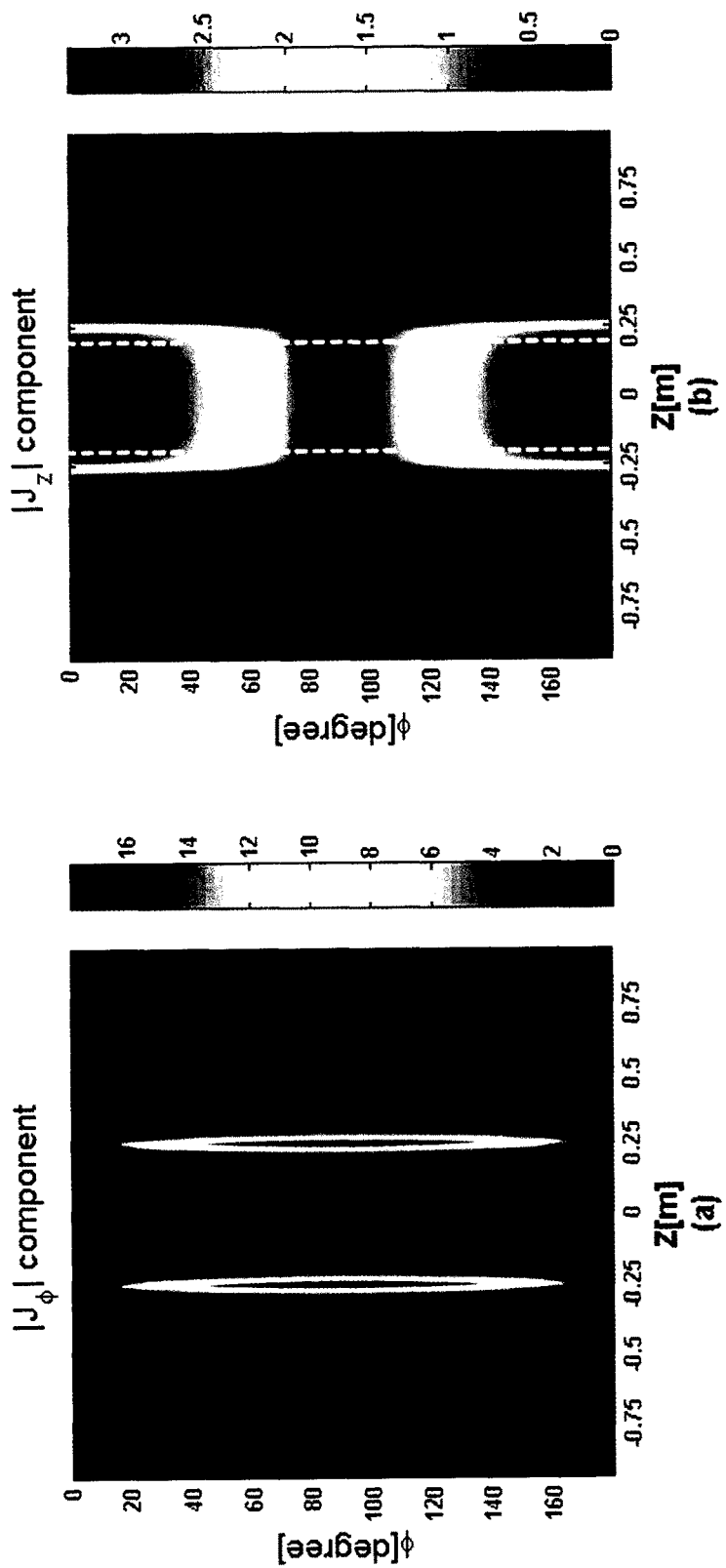
FIG. 13 illustrates RF induced current density distributions on an RF shield.

The magnitude distributions for both azimuthal and axial components of the RF eddy currents are shown in FIG. 13. The $\phi$ component illustrated on the left side (a) is mainly restricted to the end regions, while the Z component illustrated on the right side (b) is dominant over the broad middle region on the shield surface. Example apparatus and methods may consider these results for an RF transmit coil in quadrature mode, where both $J_\phi$ and $J_z$ are rotating around the z-axis at the Larmor frequency. Example apparatus and methods may design slit patterns with azimuthal symmetry.

FIG. 13 illustrates RF induced current density distributions on a long RF shield as computed via Equations [7, 8] with given parameters. Note that the gray scales for the $\phi$ component (a) and Z component (b) of the RF eddy current density are different to illustrate their variations as a function of azimuthal angle $\phi$ and axial distance z. To prevent the disruption of the azimuthal RF eddy currents, the extent to which the axial slots are limited in the z direction is indicated by the white dashed lines in the figure.

Figure 14:
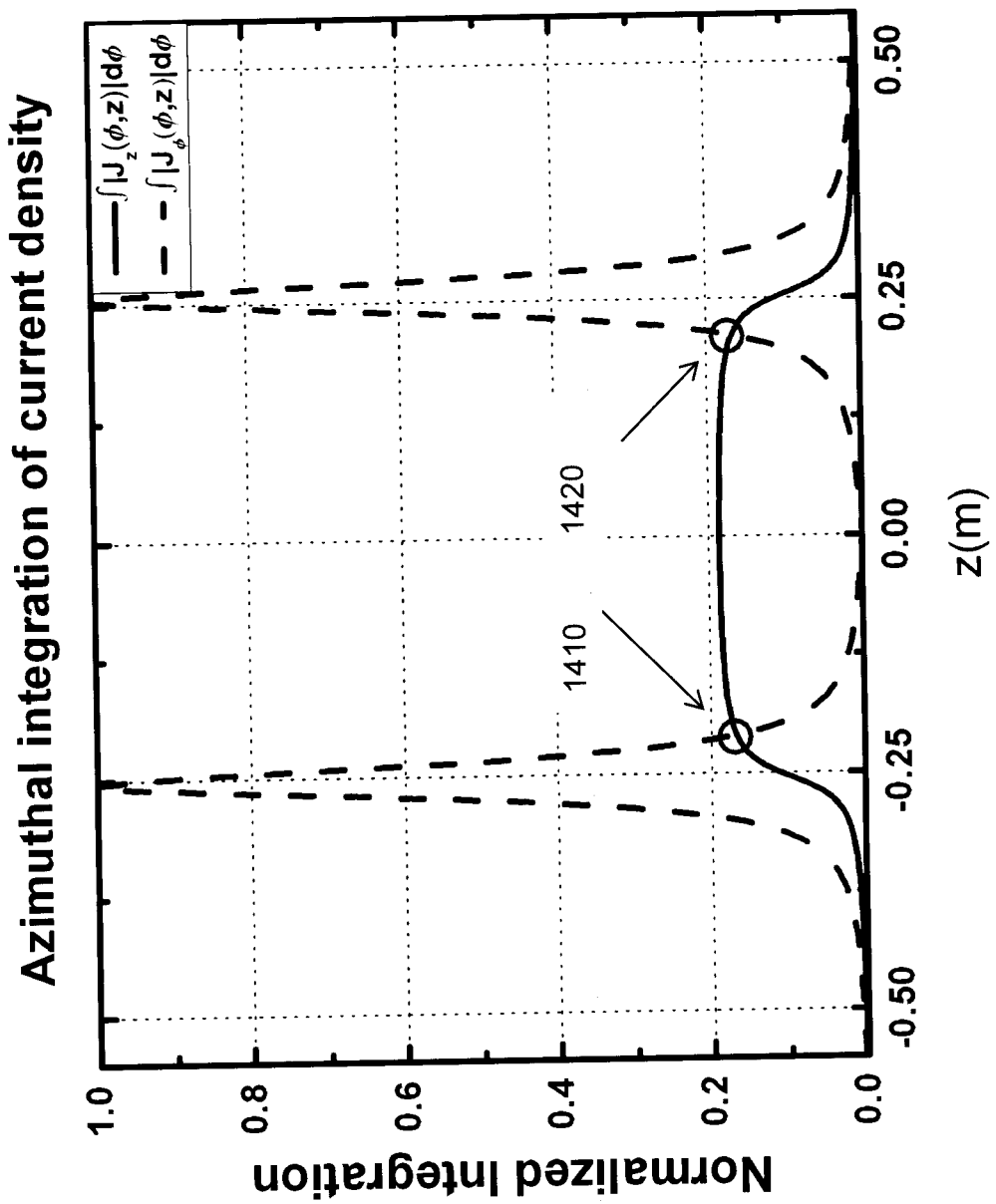
FIG. 14 illustrates an azimuthal integration of current density.

To determine which component (ϕ, Z) is dominant at a particular z position, integration along the azimuthal direction is carried out as shown in FIG. 14. FIG. 14 illustrates normalized current components after integration over the total azimuthal angle. The circled intersections 1410 and 1420 are the points that divide the shield into a Z-component-dominant region and ϕ-component-dominant region. For this example, z∈(−20 cm, 20 cm) is the Z-component-dominant region.

In one embodiment, example apparatus and methods seek to lengthen the axial slits as much as possible without impeding the RF eddy current return paths. For a given RF transmit coil and RF shield, example apparatus and methods determine the RF current Z component dominant region as shown through the simulations of the RF shield eddy current density. The axial slit length is then restricted accordingly. This optimal choice is then input to processing configured to place the azimuthal cuts to further reduce gradient current heating.

Returning briefly to FIG. 4, in one embodiment, after the axial cuts have been optimized, the azimuthal cuts may be optimized. A 3D simulated eddy current pattern in the end region of an unwrapped finite-length shield with only axial slits is shown in FIG. 4. The use of a planar (e.g., unwrapped) geometry provides a good approximation by comparing simulations with and without the strip curvature. This is understandable because the cylindrical RF shield is in close proximity to the cylindrically curved gradient coils. FIG. 4 illustrates an eddy current magnitude distribution from a simulation of the unwrapped RF shield given an optimized pattern of axial slits. The current magnitudes follow the scheme indicated by the vertical gray scale bar in arbitrary units. A pair of squeezed fingerprint coils 410 with a gap between them is modeled to mimic the behavior of a transverse gradient coil in a split MRI system. Two horizontal azimuthal "cold" bands 420 where minimized heating would occur are evident near the "eyes" of the gradient wire patterns 410.

Cuts made along the big dimension and centered on "cold" bands where the electric field vanishes are an effective way to suppress eddy current heating. Thus, for a single pair of fingerprints characterizing a single transverse gradient coil, gradient simulations confirm that one azimuthal cut going through the "cold" band 420 and completely circumscribing the shield 400 (e.g., subtending 360 degrees) is a good choice for an end region. To compare the relative effectiveness of different RF shield designs for heat reduction, analyses were conducted that normalized the total eddy-current ohmic power deposited on an RF shield with no azimuthal cuts as illustrated in FIG. 4. A pair of azimuthal slits made in the cold bands as illustrated in FIG. 6 lead to a 79% reduction in heating (from 1.00 to 0.21). The cold bands bisect the strip regions for the dimensions of this model, but this will not generally be true for longer shields where the normal component of the gradient field may be less homogeneous.

Figure 12:
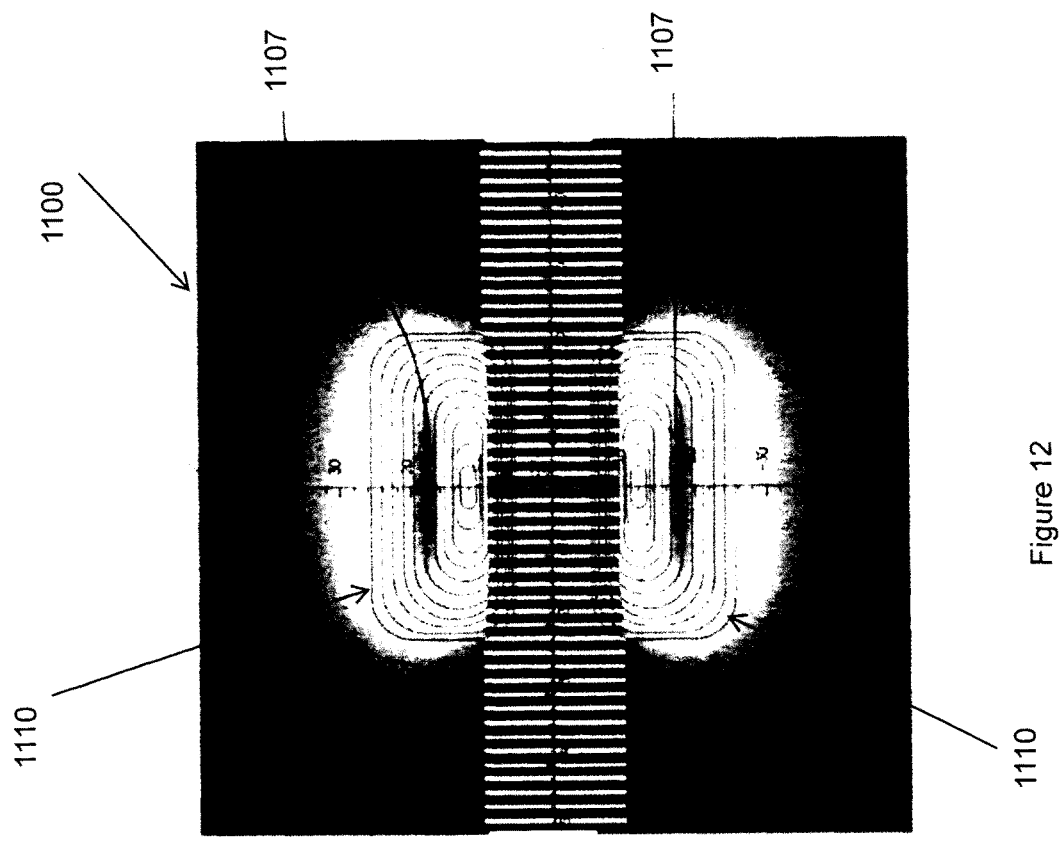
FIG. 12 illustrates a longer RF shield.

FIG. 12 illustrates a longer RF shield 1100. RF shield 1100 is illustrated interacting with gradient coil 1110. FIG. 12 illustrates the minimum eddy current region 1107 farther out in the axial direction of RF shield 1100 when compared to shorter RF shields.

Since different RF shields may interact with different gradient coils in different MRI apparatus, one example method may include identifying the central bands of minimum eddy current. In one embodiment, the central bands of minimum eddy current may be identified using numerical simulations. The example method may then position azimuthal cuts based, at least in part, on the location of the central bands of minimum eddy current as determined by numerical simulation.

Minimum eddy current regions depend on the size of the RF shield and the relative position of the gradient coil wires. However, as illustrated in FIG. 12, larger shield lengths do not move the location of the minimum eddy current significantly farther out in the axial direction. Instead, the location of the minimum eddy current remains closely connected to the gradient fingerprint pattern. Therefore example apparatus and methods may place slots based on the gradient fingerprint pattern.

If two transverse gradient coils are symmetrically constructed (e.g., offset from each other by 90 degrees), then pairs of azimuthal cuts can address heating problems for both sets of gradient coils. Example apparatus and methods may add azimuthal cuts until a desired heating attribute is achieved. For example, additional cuts can be placed over the new cold bands identified after placing the first azimuthal cut. In different embodiments, a total of three azimuthal cuts in a given end region may be employed or two azimuthal cuts could be placed to trisect a strip. Example apparatus methods may consider the homogeneity of the gradient field when deciding whether to place one, two, three, or more azimuthal cuts. In general, example apparatus and methods may achieve azimuthal slit optimization for a given gradient coil by using numerical simulations to find the minimum ohmic power loss, and then placing azimuthally circumscribed cuts accordingly. The optimized slits pattern may be found iteratively until the temperature level is decreased to a desirable range.

Figure 15:
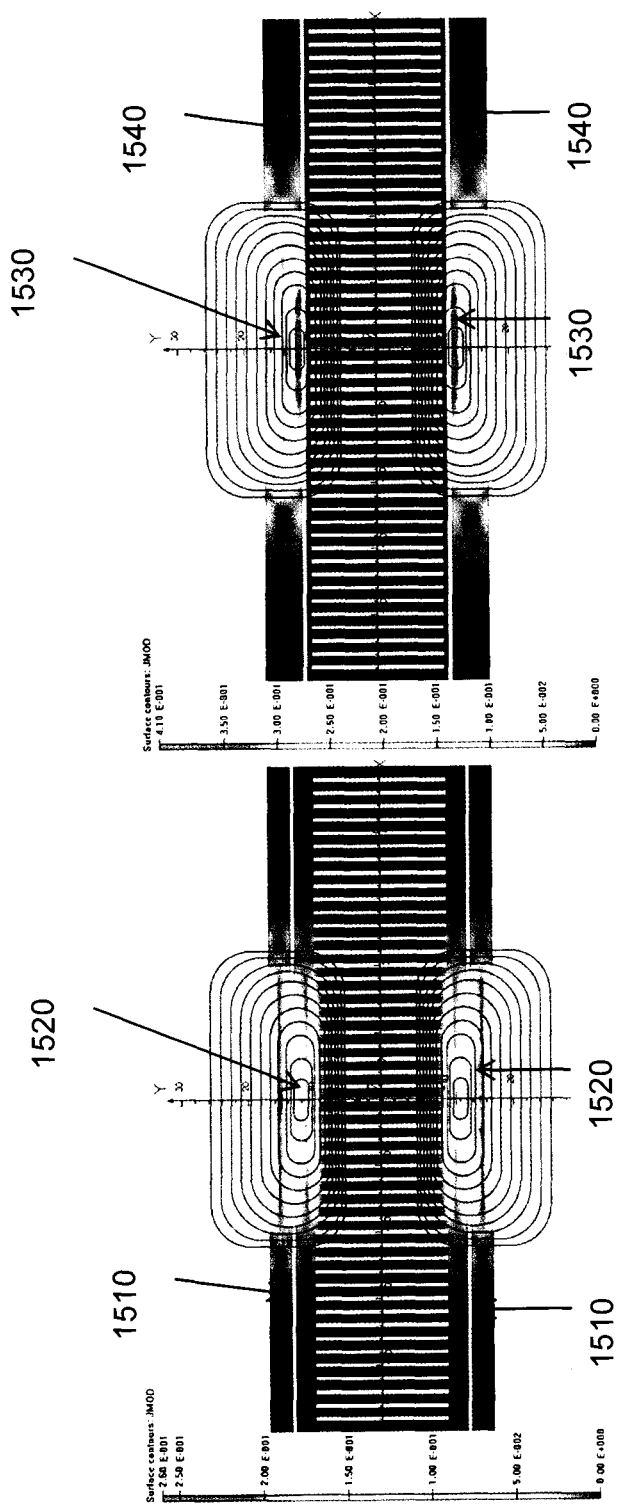
FIG. 15 illustrates RF shields with azimuthal slits in two different positions relative to cold bands.

FIG. 15 compares the difference between azimuthal slits made through the cold bands 1520 and away from those bands at a location 1530. The left side of FIG. 15 illustrates the effect of an azimuthal slit 1510 made through the center of the cold bands 1520. The right side of FIG. 15 illustrates the effect of an azimuthal slit 1540 made at a location 1530 other than through the center of the cold bands. The power reduction for slit 1510 is about 80%, and the maximum value of eddy current density is 0.26 arbitrary units compared with 1.05. On the right side, a pair 1540 of cuts 2 cm away from the center of the cold bands produced an approximate 50% power reduction and an eddy current density peak value is 0.41.

One example method begins by using a high-frequency 3D electromagnetic solution logic for the RF eddy current patterns to establish the limits on the axial-cut lengths. With a first iteration of a single azimuthal cut that approximately bisects the end strips, a 3D electromagnetic solution logic for low-frequency gradient eddy currents (typically finite-element) can be used to find the degree to which the ohmic power has been reduced. If more reduction is needed, and if the "cold band" is not at the center, the single azimuthal cut can be moved to align with it in the simulation. If more azimuthal cuts are needed, they can be equally spaced in first approximation, and the 3D EM solution logic used again to find the heating reduction. If more reduction is sought, the azimuthal-cut spacing can be adjusted so that the multiple cold bands found are at the midpoints of the new positions.

Example apparatus and methods may place optimized slots on both sides of two layered RF shields. The two layers may each have their own capacitance bridges. The different layers may be off-set (e.g., rotated slightly) from each other to avoid having single incisions penetrate the whole RF shield. The rotation mitigates RF field leakage.

Example apparatus and methods may use two or more thin copper strips instead of one thick copper strip because there is a proportionality relation between temperature increase and the thickness of the strip. Thinner copper lowers the temperature. However, a minimum thickness needs to be maintained for effective shielding.

One example method may iterate to find new minimum eddy current regions and to identify a location(s) for another slit(s) until a desired temperature suppression has been achieved. In another example the iteration may continue until a threshold number of slits has been identified. Recall that a minimal number of slits may be desired to reduce the possibility of RF leakage through the RF shield to the gradient coil.

In one embodiment, electromagnetic simulations are performed where the gradient-induced eddy current distributions on the RF shield are found by solving Maxwell equations. In different simulations the gradient field frequency may be modeled at different frequencies. In one embodiment, the gradient field frequency is set at 1500 Hz to resemble a frequency that corresponds to EPI-like sequences.

Both analytical and observed techniques may concentrate on eddy currents due to just the X or Y gradient coils. These transverse gradient coils generate large normal magnetic field components relative to the RF shield surface. The large normal magnetic field components are the main source of eddy current heating. Example methods and apparatus may ignore heating due to the Z gradient coil.

Having described the general theory upon which some example apparatus and methods may be based, this section provides greater mathematical detail for one example analytical calculation of eddy currents for a rectangular strip immersed in a normal inhomogeneous field oscillating with a frequency ω. This analysis facilitates understanding how different example apparatus and methods may determine where to place slots to minimize or reduce total ohmic power deposited on a strip. The origin of the coordinate is chosen at the center of strip. The method of separation of variables is used to solve the corresponding partial differential equations (12, 13). Faraday's and Ohm's laws provide two equations, respectively, for the electric and magnetic fields and current density, $$\nabla \times \vec{E} = -\frac{\partial \vec{B}}{\partial t} \quad \text{A.[1]}$$

$$\vec{J} = \sigma \vec{E} \quad \text{A.[2]}$$

with σ the strip conductivity. For thin strips, ignore the current density in the normal direction (the z axis) and combine A.[1], A.[2] to give $$\left(\frac{\partial J_y}{\partial x} - \frac{\partial J_x}{\partial y}\right) = -j\sigma\omega B_z \quad \text{A.[3]}$$

By continuity of the current density $\nabla \cdot \vec{J}=0$, a stream function U can be introduced and defined as:

$$J_x \hat{e}_x + J_y \hat{e}_y = \frac{1}{d}\nabla \times [U(x,y)\hat{e}_z] \quad \text{A.[4]}$$

where d is the thickness of the strip and in terms of x and y unit vectors. Thus, the current density of x and y components can be determined from the stream function as follows:

$$J_x = \frac{1}{d}\frac{\partial U(x,y)}{\partial y}, \quad \text{A.[5]}$$

$$J_y = -\frac{1}{d}\frac{\partial U(x,y)}{\partial x}$$

Substituting A.[5] into A.[3], produces a Poisson equation for the stream function (14)

$$\nabla^2 U(x,y) = j\sigma d\omega B_z(x,y) \quad \text{A.[6]}$$

By assuming current flows parallel to the edge at the boundary, the stream function satisfies the Dirichlet boundary Γ condition given by $$U(x,y)|_\Gamma 0 \quad \text{A.[7]}$$

For an arbitrary magnetic field profile, the stream function can be expanded in a series of harmonics, $$B_z(x,y) = \Sigma C_{e,e} x^e y^e + \Sigma C_{o,e} x^o y^e + \Sigma C_{e,o} x^e y^o + \Sigma C_{o,o} x^o \quad \text{A.[8]}$$

Here, C's are coefficients with subscripts e and o denoting even and odd order, respectively. In order to satisfy the boundary condition A.[7], the harmonic combinations for integers n, m and strip boundaries corresponding to the length a and width b are $$x^e y^e: \cos\frac{(2n-1)\pi x}{a}\cos\frac{(2m-1)\pi y}{b} \quad \text{A.[9]}$$

$$x^o y^e: \sin\frac{2n\pi x}{a}\cos\frac{(2m-1)\pi y}{b}$$

$$x^e y^o: \cos\frac{(2n-1)\pi x}{a}\sin\frac{2m\pi y}{b}$$

$$x^o y^o: \sin\frac{2n\pi x}{a}\sin\frac{2m\pi y}{b}$$

For the strip subjected to a static field plus a y-gradient field, $$B_z(x,y) = B_0 + G \cdot y \quad \text{A.[10]}$$

the Poisson equation can be separated into two parts $$\nabla^2 U = \nabla^2 U_1 + \nabla^2 U_2 j\omega d\sigma B_0 + j\omega d\sigma G \cdot y \quad \text{A.[11]}$$

In A.[11], $U_1$ corresponds to the homogeneous part $B_0$ and $U_2$ corresponds to the y-gradient part G·y. Both can be expanded by the corresponding harmonic terms shown previously in A.[9]:

$$U_1(x,y) = \sum_{n,m=1}^{\infty} A_{n,m}\cos v_n x \cos \mu_m y \quad \text{A.[12]}$$

$$U_2(x,y) = \sum_{n,m=1}^{\infty} C_{n,m}\cos p_n x \sin q_m y \quad \text{A.[13]}$$

$$v_n = \frac{(2n-1)\pi}{a}, \mu_m = \frac{(2m-1)\pi}{b} \quad \text{A.[14]}$$

$$p_n = \frac{(2n-1)\pi}{a} \quad q_m = \frac{2m\pi}{b} \quad (n,m=1,2,3\ldots)$$

With Fourier expansions of $B_0$ and $G \cdot y$:

$$B_0 = \sum_{n,m=1}^{\infty} B_{n,m} \cos v_n x \cos \mu_m y \quad \text{A.[15]}$$

$$G \cdot y = \sum_{n,m=1}^{\infty} D_{n,m} \cos p_n x \sin q_m y \quad \text{A.[16]}$$

The coefficients $B_{n,m}$ and $D_{n,m}$ are found to be $$B_{n,m} = \frac{16 B_0}{ab} \frac{(-1)^{m+n}}{\mu_m v_n} \quad \text{A.[17]}$$

$$D_{n,m} = \frac{8G(-1)^{m+n}}{p_n q_m a}$$

The substitution of A.[12, 13, 15, 16] into A.[11] yields $A_{n,m}$ and $C_{n,m}$:

$$A_{n,m} = \frac{j\omega\sigma d}{(v_n^2 + \mu_m^2)} B_{n,m} \quad \text{A.[18]}$$

$$C_{n,m} = \frac{-j\omega\sigma D_{n,m}}{p_n^2 + q_m^2}$$

The total time-average eddy current power for the strip under this linear gradient field can be calculated as:

$$\langle P \rangle = \frac{d}{2\sigma} \int_{-b/2}^{b/2} \int_{-a/2}^{a/2} (J_x \cdot J_x^* + J_y \cdot J_y^*) dx dy \quad \text{A.[19]}$$

Calculating the current density for both x and y components using A.[5] and A.[12, 13, 18], substituting into A.[19], and integrating over the whole strip, reveals the total average power loss as:

$$\langle P \rangle = \sum_{n,m=1}^{\infty} \left[ \frac{32 B_0^2 d\sigma\omega^2}{ab v_n^2 \mu_m^2 (v_n^2 + \mu_m^2)} + \frac{8 G^2 b d\sigma\omega^2}{a p_n^2 q_m^2 (p_n^2 + q_m^2)} \right] \quad \text{A.[20]}$$

In A.[20], the first term provides corrections to equation [1], the eddy current power loss due to the homogeneous part in the field profile, and the second term provides the power loss due to the y-gradient part in field profile. For example, if a slit is made in the x direction along the line $y=y_0$, which separates the strip into two narrower ones with new widths, $(y_0+b/2)$ and $(b/2-y_0)$, respectively, then the magnetic fields averaged over the areas of these two strips are:

$$B_0^{(1)} = \frac{1}{2}\left(B_0 + G \cdot \left(-\frac{b}{2}\right) + B_0 + G \cdot y_0\right) \quad \text{A.[21]}$$

$$B_0^{(2)} = \frac{1}{2}\left(B_0 + G \cdot \left(\frac{b}{2}\right) + B_0 + G \cdot y_0\right)$$

Applying A.[20] to these two strips reveals the average powers for them to be:

$$\langle P_1 \rangle = \sum_{n,m=1}^{\infty} \left[ \frac{32 (B_0^{(1)})^2 d\sigma\omega^2}{a\left(y_0 + \frac{b}{2}\right)(v_n^{(1)} \mu_m^{(1)})^2 ((v_n^{(1)})^2 + (\mu_m^{(1)})^2)} + \frac{8 G^2 \left(y_0 + \frac{b}{2}\right) d\sigma\omega^2}{a(p_n^{(1)} q_m^{(1)})^2 ((p_n^{(1)})^2 + (q_m^{(1)})^2)} \right] \quad \text{A.[22]}$$

$$\langle P_2 \rangle = \sum_{n,m=1}^{\infty} \left[ \frac{32 (B_0^{(2)})^2 d\sigma\omega^2}{a\left(\frac{b}{2} - y_0\right)(v_n^{(2)} \mu_m^{(2)})^2 ((v_n^{(2)})^2 + (\mu_m^{(2)})^2)} + \frac{8 G^2 \left(\frac{b}{2} - y_0\right) d\sigma\omega^2}{a(p_n^{(2)} q_m^{(2)})^2 ((p_n^{(2)})^2 + (q_m^{(2)})^2)} \right] \quad \text{A.[23]}$$

The power ratio plots for different gradient strengths are generated by using A.[20, 22, 23] to locate optimal cut positions.

Example apparatus and methods may employ an analysis based on A.[1]-[23] to place slots.

The following includes definitions of selected terms employed herein. The definitions include various examples and/or forms of components that fall within the scope of a term and that may be used for implementation. The examples are not intended to be limiting. Both singular and plural forms of terms may be within the definitions.

References to "one embodiment", "an embodiment", "one example", and "an example" indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

ASIC: application specific integrated circuit.
CD: compact disk.
CD-R: CD recordable.
CD-RW: CD rewriteable.
DVD: digital versatile disk and/or digital video disk.
LAN: local area network.
PCI: peripheral component interconnect.
PCIE: PCI express.
RAM: random access memory.
DRAM: dynamic RAM.
SRAM: synchronous RAM.
ROM: read only memory.
PROM: programmable ROM.
USB: universal serial bus.
WAN: wide area network.

"Computer component" as used herein, refers to a computer-related entity (e.g., hardware, firmware, software in execution, combinations thereof). Computer components may include, for example, a process running on a processor, a processor, an object, an executable, a thread of execution, and a computer. A computer component(s) may reside within a process and/or thread. A computer component may be localized on one computer and/or may be distributed between multiple computers.

"Computer-readable medium" as used herein, refers to a non-transitory medium that stores signals, instructions and/or data. A computer-readable medium may take forms, including, but not limited to, non-volatile media, and volatile media. Non-volatile media may include, for example, optical disks, magnetic disks, and other disks. Volatile media may include, for example, semiconductor memories, dynamic memory, and other memories. Common forms of a computer-readable medium may include, but are not limited to, a floppy disk, a flexible disk, a hard disk, a magnetic tape, other magnetic medium, an ASIC, a CD, other optical medium, a RAM, a ROM, a memory chip or card, a memory stick, and other media from which a computer, a processor or other electronic device can read.

"Logic" as used herein, includes but is not limited to hardware, firmware, software in execution on a machine, and/or combinations of each to perform a function(s) or an action(s), and/or to cause a function or action from another logic, method, and/or system. Logic may include a software-controlled microprocessor, a discrete logic (e.g., ASIC), an analog circuit, a digital circuit, a programmed logic device, a memory device containing instructions, and other hardware. Logic may include one or more gates, combinations of gates, or other circuit components. Where multiple logical logics are described, it may be possible to incorporate the multiple logical logics into one physical logic. Similarly, where a single logical logic is described, it may be possible to distribute that single logical logic between multiple physical logics.

An "operable connection" or a connection by which entities are "operably connected", is one in which signals, physical communications, and/or logical communications may be sent and/or received. An operable connection may include a physical interface, an electrical interface, and/or a data interface. An operable connection may include differing combinations of interfaces and/or connections sufficient to allow operable control. For example, two entities can be operably connected to communicate signals to each other directly or through one or more intermediate entities (e.g., processor, operating system, logic, software). Logical and/or physical communication channels can be used to create an operable connection.

"Software" as used herein, includes but is not limited to, one or more executable instructions that cause a computer, processor, or other electronic device to perform functions, actions and/or behave in a desired manner. "Software" does not refer to stored instructions being claimed as stored instructions per se (e.g., a program listing). The instructions may be embodied in various forms including routines, algorithms, modules, methods, threads, and/or programs including separate applications or code from dynamically linked libraries.

"User" as used herein, includes but is not limited to one or more persons, software, logics, computers or other devices, or combinations of these.

Some portions of the detailed descriptions that follow are presented in terms of algorithms and symbolic representations of operations on data bits within a memory. These algorithmic descriptions and representations are used by those skilled in the art to convey the substance of their work to others. An algorithm, here and generally, is conceived to be a sequence of operations that produce a result. The operations may include physical manipulations of physical quantities. Usually, though not necessarily, the physical quantities take the form of electrical or magnetic signals capable of being stored, transferred, combined, compared, or otherwise manipulated in a logic. The physical manipulations create a concrete, tangible, useful, real-world result.

It has proven convenient at times, principally for reasons of common usage, to refer to these signals as bits, values, elements, symbols, characters, terms, or numbers. It should be borne in mind, however, that these and similar terms are to be associated with the appropriate physical quantities and are merely convenient labels applied to these quantities. Unless specifically stated otherwise, it is to be appreciated that throughout the description, terms including processing, computing, determining, and analyzing, refer to actions and processes of a computer system, logic, processor, or similar electronic device that manipulates and transforms data represented as physical (electronic) quantities.

Example methods may be better appreciated with reference to flow diagrams. For purposes of simplicity of explanation, the illustrated methodologies are shown and described as a series of blocks. However, it is to be appreciated that the methodologies are not limited by the order of the blocks, as some blocks can occur in different orders and/or concurrently with other blocks from that shown and described. Moreover, less than all the illustrated blocks may be required to implement an example methodology. Blocks may be combined or separated into multiple components. Furthermore, additional and/or alternative methodologies can employ additional, not illustrated blocks.

Figure 16:
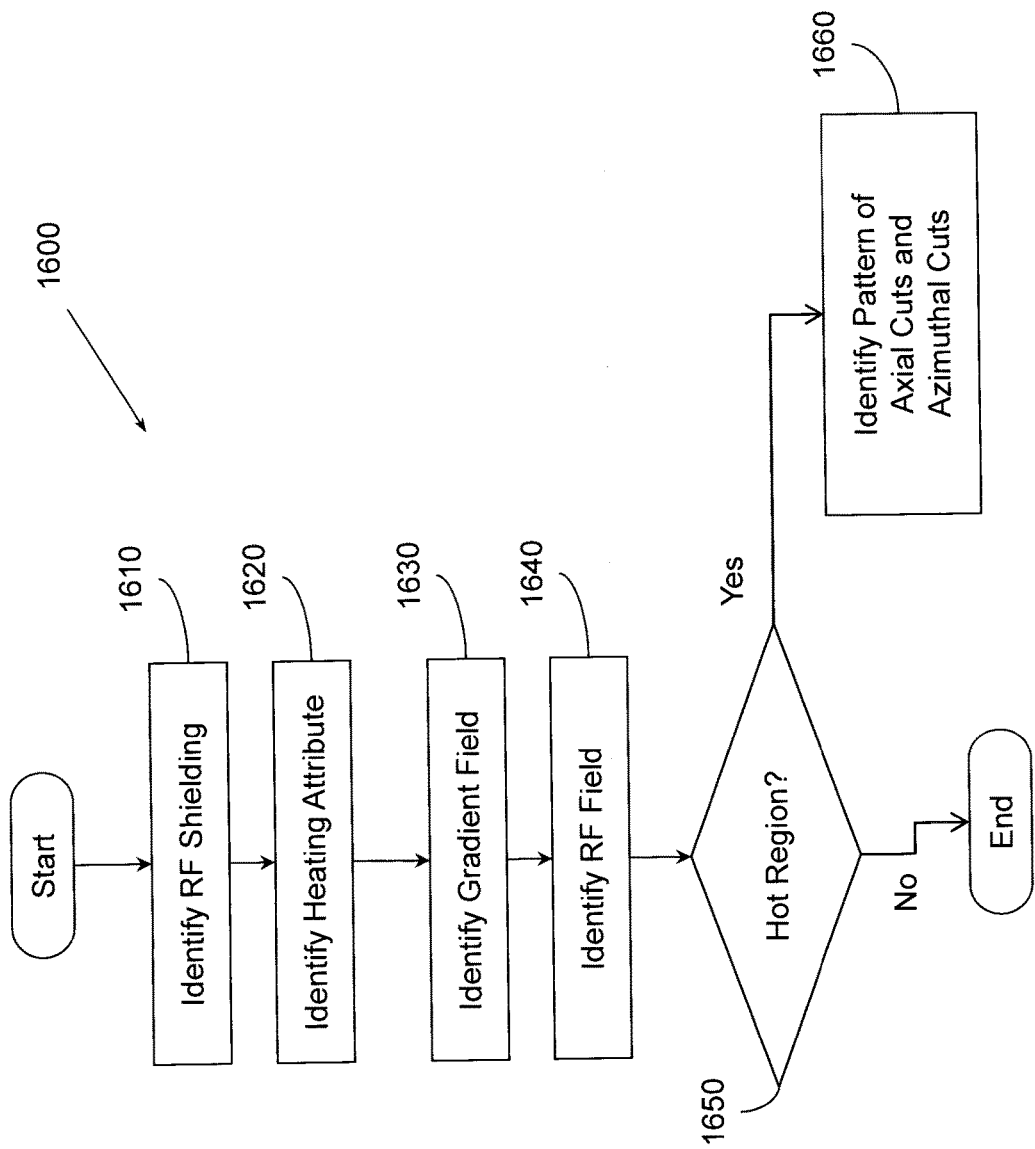
FIG. 16 illustrates a method associated with designing an RF shield.

FIG. 16 illustrates a method 1600 for designing a magnetic resonance imaging (MRI) radio frequency (RF) shield. Method 1600 includes, at 1610, identifying a desired degree of RF shielding to be achieved by the RF shield. Identifying the desired degree of RF shielding may include, for example, receiving a design parameter from a process, logic, or user, calculating a degree of shielding needed for a procedure (e.g., imaging procedure, image guided surgical procedure), or other actions. Recall that an ideal RF shield would be transparent to a gradient field produced by a gradient coil in the MRI apparatus and would be opaque to an RF field produced by an RF transmission coil in the MRI apparatus. However, an ideal shield may not be required. Recall also that both gradient fields and RF fields can induce eddy currents in an RF shield. The eddy currents can cause heating in the RF shield.

Thus, method 1600 includes, at 1620, identifying a desired heating attribute for the RF shield. Example heating attributes include, for example, a rate of change for temperature on the RF shield, a maximum temperature on the RF shield, a temperature distribution on the RF shield, and other attributes. Different heating attributes may be associated with different procedures. For example, a first higher rate of temperature change may be tolerable in a first type of MR guided procedure while a second lower rate of temperature change may be required for a second type of MR guided procedure. Identifying the desired heating attribute may include receiving a design parameter from a user, process, or apparatus. Identifying the desired heating attribute may also include analyzing strengths and durations of fields expected during procedure.

Heating in the RF shield depends on eddy currents induced in the RF shield and the eddy currents depend on the fields. Therefore method 1600 includes, at 1630, identifying a gradient field to which the RF shield will be exposed. The gradient field will be produced by a gradient coil in the MRI apparatus. Method 1600 also includes, at 1640, identifying an RF field to which the RF shield will be exposed. The RF field will be produced by an RF transmission coil in the MRI apparatus. Identifying the gradient field and the RF field may include receiving a design parameter from a user, process, or apparatus. Identifying the gradient field and the RF field may also include predicting the strength and duration of fields expected during an MR procedure.

Method 1600 may also include, at 1650, determining whether a hot region exists on the RF shield. A hot region may be identified as a region of maximal eddy current ohmic power. A hot region may also be identified as a region where a determined heating attribute does not satisfy the desired heating attribute. The heating attribute can be determined in different ways. In one example, identifying the hot region involves analyzing gradient induced eddy current distribution on the RF shield. Analyzing gradient induced eddy current distribution on the RF shield may include identifying a region of maximal eddy current ohmic power on the RF shield. In some examples, identifying the hot region may include considering only gradient induced eddy current distribution due to an X gradient coil and a Y gradient coil in the MRI apparatus.

If the determination at 1650 is yes, that a hot region exists, then method 1600 proceeds, at 1660, to identify one or more axial cuts to be made in the RF shield to reduce gradient eddy current heating produced in the RF shield by the gradient field. Method 1600 also includes, at 1660, subsequently identifying one or more azimuthal cuts to be made in the RF shield to further reduce gradient eddy current heating produced in the RF shield by the gradient field. In one embodiment the azimuthal cuts are identified after the axial cuts are produced.

The actions performed at 1660 identify axial cuts and azimuthal cuts that will cause the RF shield to exhibit the desired heating attribute while maintaining the desired degree of RF shielding. In one embodiment, the actions performed at 1660 determine the minimal number of axial cuts and azimuthal cuts that achieve the desired heating attribute while maintaining the desired RF shielding performance. In one embodiment, the azimuthal cuts are designed with azimuthal symmetry. In one embodiment, the azimuthal cuts are offset to account for rotating fields produced by quadrature operation of the MRI apparatus.

In one embodiment, method 1600 may also include controlling an automated RF shield fabricator to cut the one or more axial cuts and the one or more azimuthal cuts in the RF shield.

Figure 17:
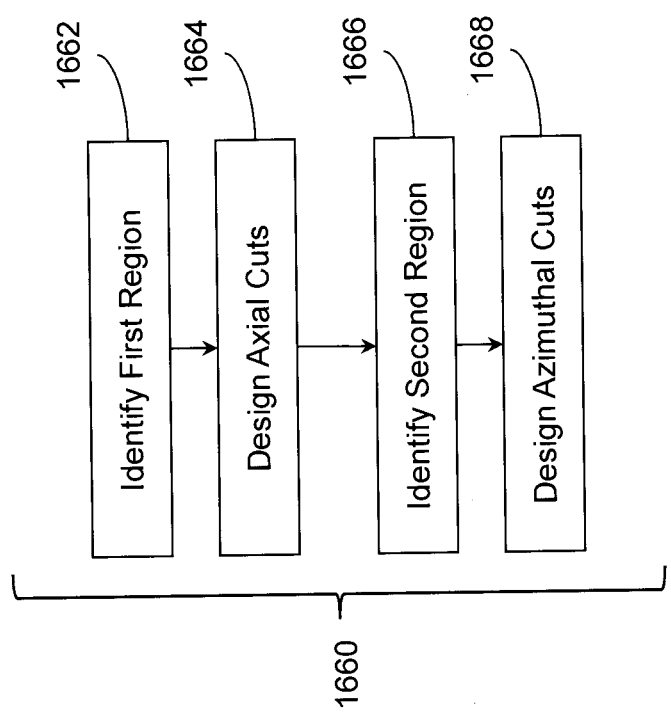
FIG. 17 illustrates a portion of a method associated with designing an RF shield.

FIG. 17 illustrates additional detail for action 1660. The additional detail may include, at 1662, identifying a first region on the RF shield to place axial cuts that will reduce a gradient induced eddy current in the RF shield. The additional detail may also include, at 1664, designing the one or more axial cuts to make in the first region. Designing the axial cuts may involve determining the number, size, shape, and position of the axial cuts.

In one example, identifying the first region at 1662 involves analyzing RF eddy current patterns that would be induced in the RF shield by the RF field. In this example, designing the axial cuts at 1664 includes establishing a position, length, and width for an axial cut that will reduce ohmic heating yet not impede an RF eddy current induced in the RF shield.

In another example, identifying the first region at 1662 involves identifying an RF current Z component dominant region in the RF shield. In this example, designing the axial cuts at 1664 includes restricting the axial cuts to be in the RF current Z component dominant region.

In another example, identifying the first region at 1662 involves identifying a domain [−Zc, +Zc] where the axial component RF induced current density is dominant. In this example, designing the axial cuts at 1664 includes establishing a position, length, and width for an axial cut based, at least in part, on the domain [−Zc, +Zc]. In one embodiment, the [−Zc, +Zc] domain is identified by:

$$\int_0^\pi |J_z(\phi,z)| d\phi > \int_0^\pi |J_\phi(\phi,z)| d\phi \text{ for } z \in [-Z_c, +Z_c].$$

In yet another embodiment, identifying the first region at 1662 involves measuring temperature on the RF shield while the RF shield is exposed to the gradient field and the RF field.

The additional detail may also include, at 1666, identifying a second region on the RF shield to place azimuthal cuts that will reduce a gradient induced eddy current in the RF shield. The location of the second region depends, at least in part, on attributes of the first region. The attributes can include, for example, the size of the first region, the shape of the first region, the position of the first region, and the size, shape, orientation, and number of axial cuts in the first region. The additional detail may also include, at 1668, designing the azimuthal cuts to make in the second region.

In one embodiment, identifying the second region at 1666 involves identifying a cold band where there is minimal eddy current ohmic power on the RF shield. In this example, designing the azimuthal cut at 1668 may involve placing the azimuthal cut in or near the cold band. In another embodiment, identifying the second region at 1666 may be based, at least in part, on simulating a power ratio for one or more potential azimuthal slit positions. In this example, designing the azimuthal cut at 1668 may involve placing an azimuthal cut based on a minima identified in a power curve produced during the simulation. In one embodiment, method 1600 may iterate through actions 1666 and 1668 until a termination condition is satisfied.

In one embodiment, identifying the second region at 1666 involves measuring temperature on the RF shield while the RF shield is exposed to the gradient field and the RF field. In this embodiment, designing the azimuthal cut may involve placing the cut in a region with a minimal temperature.

While FIGS. 16 and 17 illustrates various actions occurring in serial, it is to be appreciated that various actions illustrated in FIGS. 16 and 17 could occur substantially in parallel. By way of illustration, a first process could identify fields, a second process could identify design requirements (e.g., shielding, heating attribute), a third process could identify regions and a fourth process could design cuts. While four processes are described, it is to be appreciated that a greater and/or lesser number of processes could be employed and that lightweight processes, regular processes, threads, and other approaches could be employed. Additionally, while FIGS. 16 and 17 show a single iteration through method 1600, various actions could be iterated over.

In one example, a method may be implemented as computer executable instructions. Thus, in one example, a computer-readable medium may store computer executable instructions that if executed by a machine (e.g., processor) cause the machine to perform method 1600. While executable instructions associated with method 1600 are described as being stored on a computer-readable medium, it is to be appreciated that executable instructions associated with other example methods described herein may also be stored on a computer-readable medium.

Figure 18:
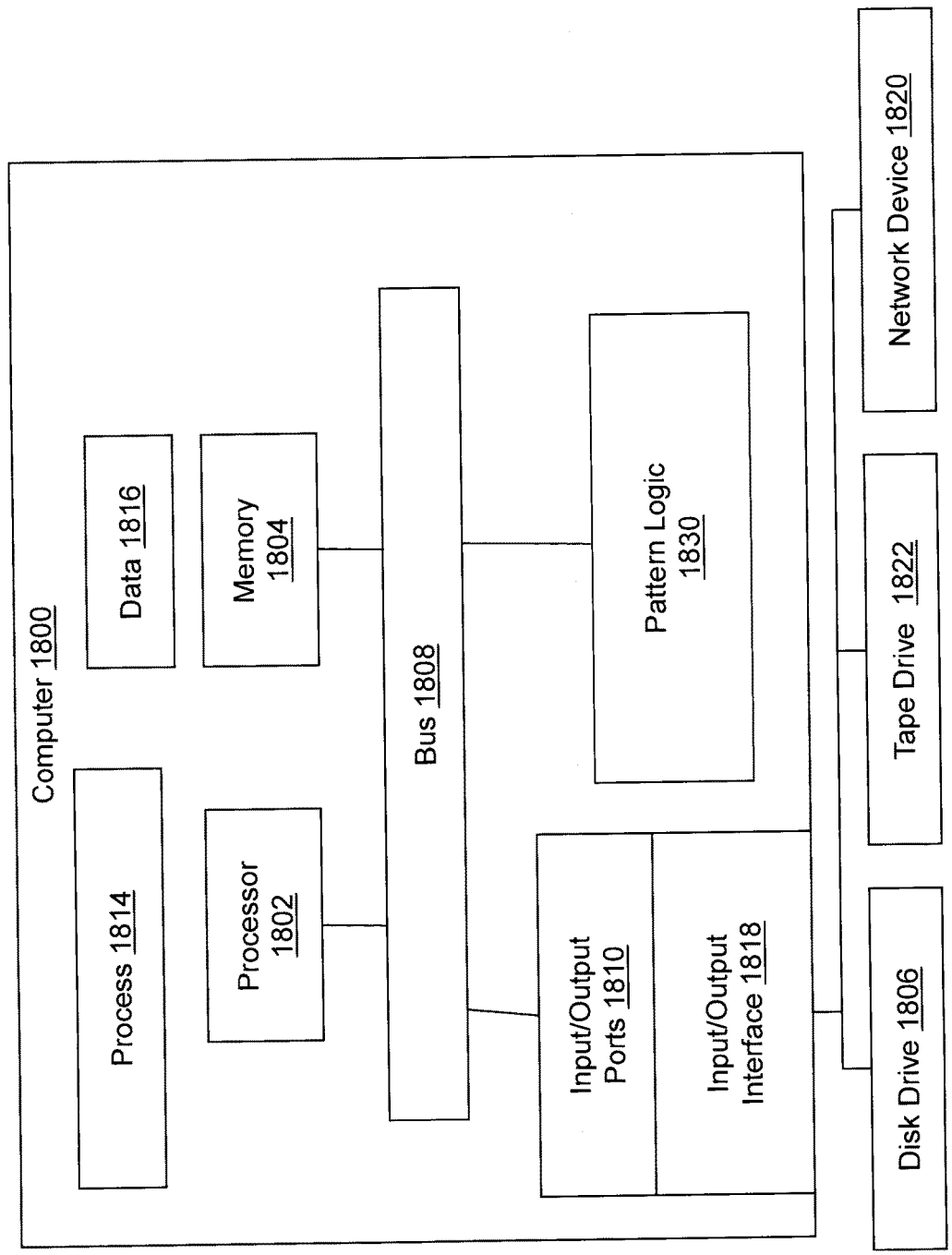
FIG. 18 illustrates an apparatus configured to design an RF shield.

FIG. 18 illustrates an example computing device in which example systems and methods described herein, and equivalents, may operate. The example computing device may be a computer 1800 that includes a processor 1802, a memory 1804, and input/output ports 1810 operably connected by a bus 1808. In one example, the computer 1800 may include a pattern logic 1830 configured to identify the pattern of axial and azimuthal cuts to be made in an RF shield. In different examples, the logic 1830 may be implemented in hardware, software, firmware, and/or combinations thereof. While the logic 1830 is illustrated as a hardware component attached to the bus 1808, it is to be appreciated that in one example, the logic 1830 could be implemented in the processor 1802.

Logic 1830 may provide means (e.g., hardware, software, firmware) for identifying a set of axial cuts to be made in an RF shield. The set of axial cuts may be determined, at least in part, on an effect an axial cut would have on reducing gradient field induced eddy currents in the RF shield. Logic 1830 may also provide means (e.g., hardware, software, firmware) for identifying a set of azimuthal cuts to be made in the RF shield. The set of azimuthal cuts are determined, at least in part, on an effect an azimuthal cut would have on reducing gradient field induced eddy currents in the RF shield. Logic 1830 may also provide means for controlling an RF shield fabricator to configure the RF shield with the set of axial cuts and the set of azimuthal cuts. The means associated with logic 1830 may be implemented, for example, as an ASIC programmed to design and implement the pattern. The means may also be implemented as computer executable instructions that are presented to computer 1800 as data 1816 that are temporarily stored in memory 1804 and then executed by processor 1802.

Generally describing an example configuration of the computer 1800, the processor 1802 may be a variety of various processors including dual microprocessor and other multi-processor architectures. A memory 1804 may include volatile memory and/or non-volatile memory. Non-volatile memory may include, for example, ROM, PROM, and other memory. Volatile memory may include, for example, RAM, SRAM, DRAM, and other memory.

A disk 1806 may be operably connected to the computer 1800 via, for example, an input/output interface (e.g., card, device) 1818 and an input/output port 1810. The disk 1806 may be, for example, a magnetic disk drive, a solid state disk drive, a floppy disk drive, a tape drive, a Zip drive, a flash memory card, a memory stick, and other storage. Furthermore, the disk 1806 may be a CD-ROM drive, a CD-R drive, a CD-RW drive, a DVD ROM drive, a Blu-Ray drive, an HD-DVD drive, or other drive. The memory 1804 can store a process 1814 and/or a data 1816, for example. The disk 1806 and/or the memory 1804 can store an operating system that controls and allocates resources of the computer 1800.

The bus 1808 may be a single internal bus interconnect architecture and/or other bus or mesh architectures. While a single bus is illustrated, it is to be appreciated that the computer 1800 may communicate with various devices, logics, and peripherals using other busses (e.g., PCIE, 1394, USB, Ethernet). The bus 1808 can be types including, for example, a memory bus, a memory controller, a peripheral bus, an external bus, a crossbar switch, and/or a local bus.

The computer 1800 may interact with input/output devices via the i/o interfaces 1818 and the input/output ports 1810. Input/output devices may be, for example, a keyboard, a microphone, a pointing and selection device, cameras, video cards, displays, the disk 1806, the network devices 1820, a metal fabrication device, and other devices. The input/output ports 1810 may include, for example, serial ports, parallel ports, and USB ports.

The computer 1800 can operate in a network environment and thus may be connected to the network devices 1820 via the i/o interfaces 1818, and/or the i/o ports 1810. Through the network devices 1820, the computer 1800 may interact with a network. Through the network, the computer 1800 may be logically connected to remote computers. Networks with which the computer 1800 may interact include, but are not limited to, a LAN, a WAN, and other networks. A metal fabrication device may be operably connected to computer 1800 through the network devices 1820.

Figure 19:
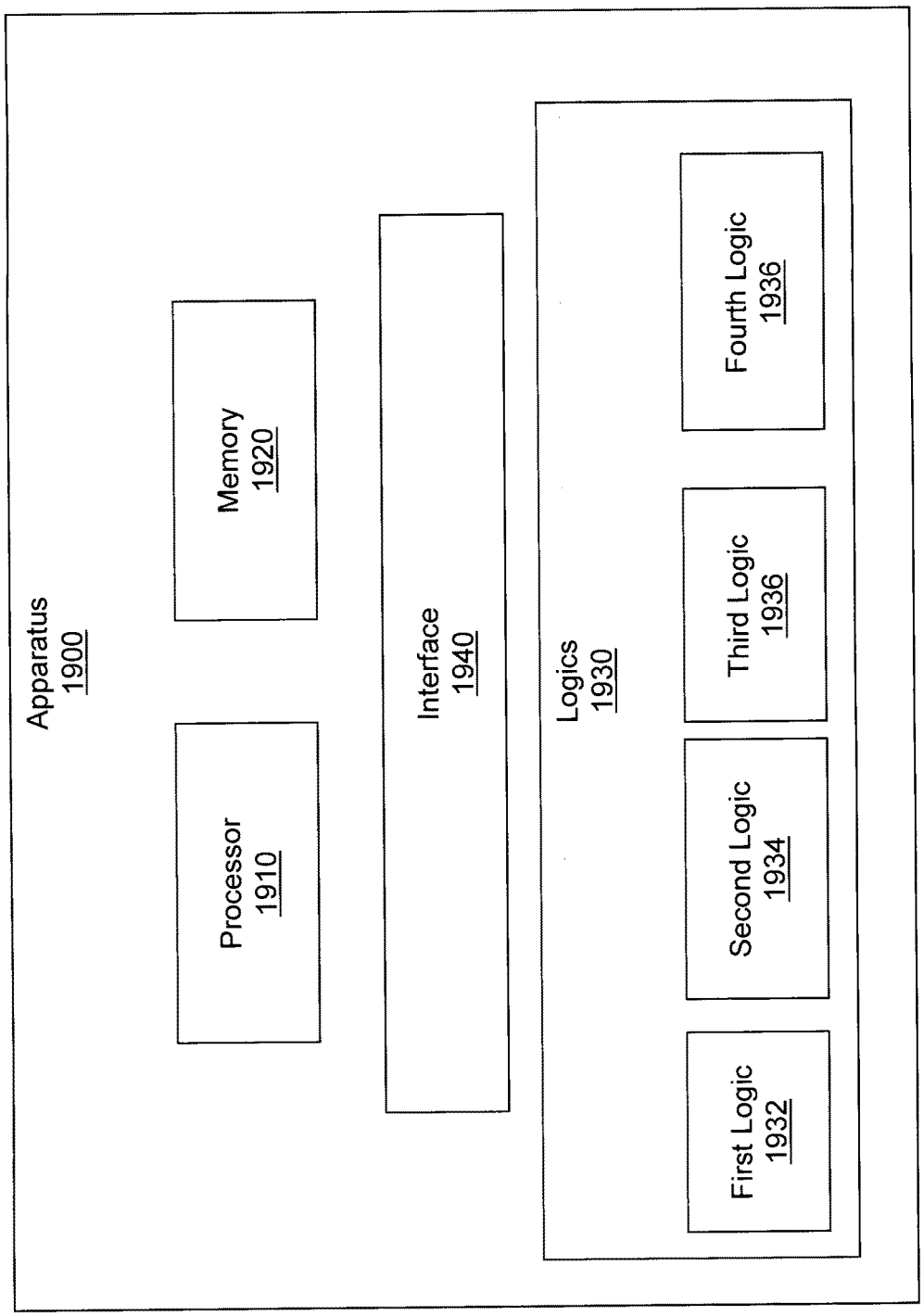
FIG. 19 illustrates an apparatus configured to design an RF shield.

FIG. 19 illustrates an apparatus 1900. Apparatus 1900 includes a processor 1910, a memory 1920, a set 1930 of logics, and an interface 1940 to connect the processor 1910, the memory 1920, and the set 1930 of logics. In one embodiment the set 1930 of logics is configured to design a pattern of axial cuts and azimuthal cuts to be made in an RF shield for use with an MRI apparatus. In one embodiment, apparatus 1900 may be a special purpose computer that is created as a result of programming a general purpose computer. In another embodiment, apparatus 1900 may include special purpose circuits that are added to a general purpose computer to produce a special purpose computer.

In one embodiment, the set 1930 of logics includes a first logic 1932, a second logic 1934, a third logic 1936 and a fourth logic 1938. In one embodiment, the first logic 1932 is configured to identify a first (e.g., central) region of the RF shield in which axial cuts are to be made to reduce ohmic heating of the RF shield due to gradient induced eddy currents.

In one embodiment, the second logic 1934 is configured to establish a limit for the length of the axial cuts based on a high frequency electromagnetic analysis of RF induced eddy current patterns in the RF shield.

In one embodiment, the third logic 1936 is configured to establish a second (e.g., end ring) region in the RF shield in which azimuthal cuts are to be made to reduce ohmic heating of the RF shield due to gradient induced eddy currents. The third logic 1936 is configured to determine the size and location of the end ring region based, at least in part, on the location and size of the central region and on the axial cuts in the central region.

In one embodiment, the fourth logic 1938 is configured to determine a number of 360 degree azimuthal cuts to be made through the end ring region. The fourth logic 1938 may be configured to determine the number of cuts based on a degree of ohmic power reduction produced by the axial cuts and azimuthal cuts as determined by a low frequency electromagnetic gradient current analysis.

Figure 20:
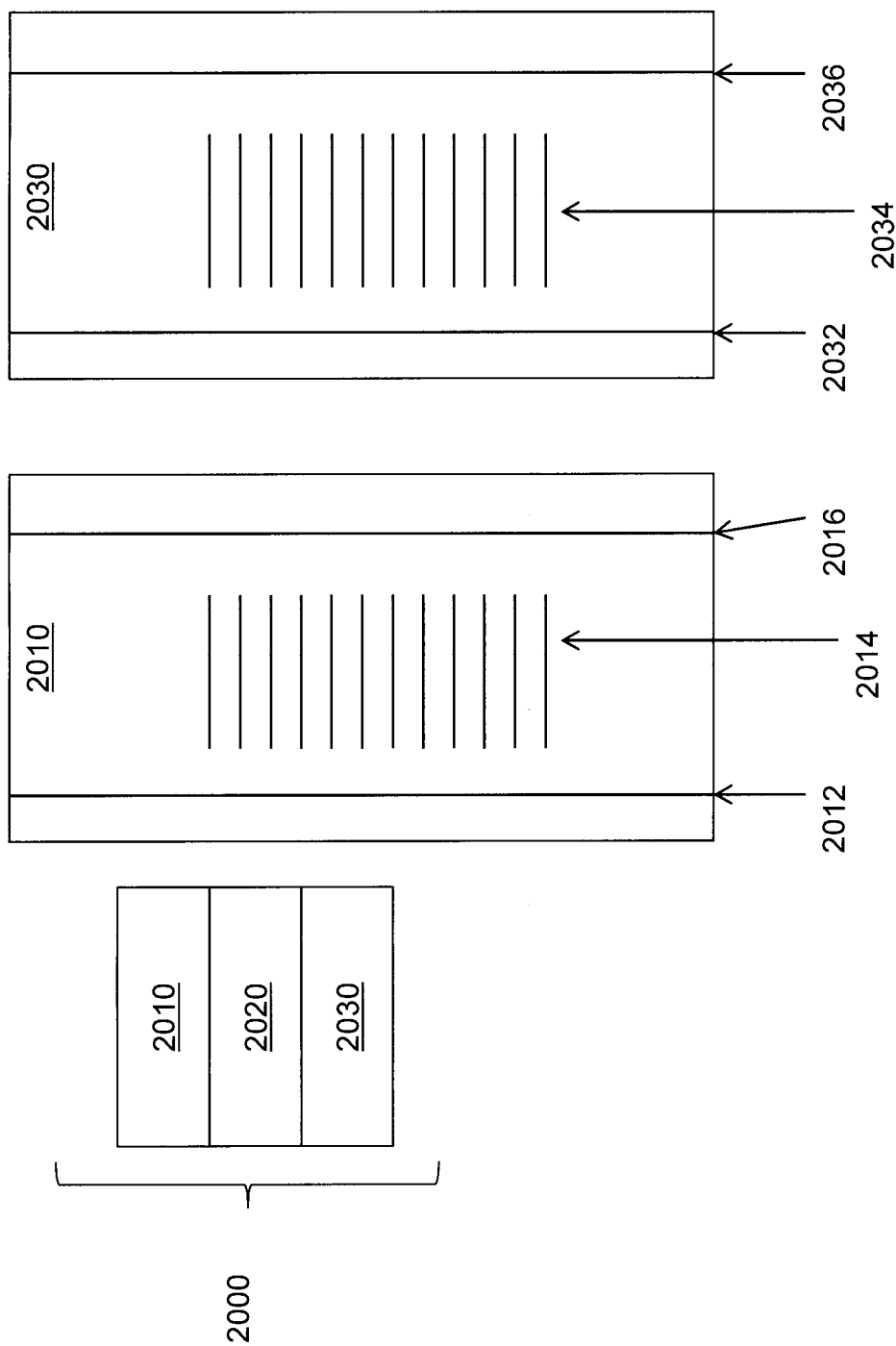
FIG. 20 illustrates an RF shield.

FIG. 20 illustrates an example RF shield 2000. Attributes of shield 2000 may be designed by example methods and apparatus described herein. In one embodiment, RF shield 2000 may be a printed circuit board radio frequency (RF) shield for use with a hybrid magnetic resonance imaging (MRI) apparatus. The RF shield 2000 may include a dielectric material layer 2020, a first copper sheet 2010 attached to a first side of the dielectric material 2020 and a second copper sheet 2030 attached to a second, different side of the dielectric material 2020.

In one embodiment, the first copper sheet 2010 includes a first set of axial cuts 2014 that are sized and positioned to reduce ohmic heating due to eddy currents induced in the RF shield 2000 by a split X-gradient coil in the MRI apparatus without disrupting eddy currents induced in the RF shield by an RF transmission coil in the MRI apparatus. The first copper sheet 2010 may also include a first set of azimuthal cuts 2012 and 2016. The azimuthal cuts 2012 and 2016 may be sized and positioned to reduce ohmic heating due to eddy currents induced in the RF shield by the split X-gradient coil. While two azimuthal cuts 2012 and 2016 are illustrated, a greater and/or lesser number of azimuthal cuts may be employed.

In one embodiment, the second copper sheet 2030 also includes a second set of axial cuts 2034 that are sized and positioned to reduce ohmic heating due to eddy currents induced in the RF shield 2000 by a split Y-gradient coil in the MRI apparatus. The second set of axial cuts 2034 are sized and positioned to not disrupt eddy currents induced in the RF shield by the RF transmission coil. In this embodiment, the second copper sheet 2030 also includes a second set of azimuthal cuts 2032 and 2036 that are sized and positioned to reduce ohmic heating due to eddy currents induced in the RF shield by the split Y-gradient coil.

In one embodiment of RF shield 2000, at least one of, a length, a width, and a position of a member of the first set of axial cuts, a member of the second set of axial cuts, a member of the first set of azimuthal cuts, and a member of the second set of azimuthal cuts are determined, at least in part, by eddy current pattern distributions on the first copper sheet and the second copper sheet.

In one embodiment of printed circuit board RF shield 2000, the first set of axial cuts 2014 and the first set of azimuthal cuts 2012 and 2016 are positioned with respect to the second set of axial cuts 2034 and the second set of azimuthal cuts 2032 and 2036 to account for rotating fields produced by quadrature operation of a hybrid MRI system.

While example apparatus, methods, and other embodiments have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the apparatus, methods, and other embodiments described herein. Therefore, the invention is not limited to the specific details, the representative apparatus, and illustrative examples shown and described. Thus, this application is intended to embrace alterations, modifications, and variations that fall within the scope of the appended claims.

To the extent that the term "includes" or "including" is employed in the detailed description or the claims, it is intended to be inclusive in a manner similar to the term "comprising" as that term is interpreted when employed as a transitional word in a claim.

To the extent that the term "or" is employed in the detailed description or claims (e.g., A or B) it is intended to mean "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

To the extent that the phrase "one or more of, A, B, and C" is employed herein, (e.g., a data store configured to store one or more of, A, B, and C) it is intended to convey the set of possibilities A, B, C, AB, AC, BC, ABC, AAA, AAB, AABB, AABBC, AABBCC, etc. (e.g., the data store may store only A, only B, only C, A&B, A&C, B&C, A&B&C, A&A&A, A&A&B, A&A&B&B, A&A&B&B&C, A&A&B&B&C&C, etc.). It is not intended to require one of A, one of B, and one of C. When the applicants intend to indicate "at least one of A, at least one of B, and at least one of C", then the phrasing "at least one of A, at least one of B, and at least one of C" will be employed.

Throughout this specification and the claims that follow, unless the context requires otherwise, the words 'comprise' and 'include' and variations such as 'comprising' and 'including' will be understood to be terms of inclusion and not exclusion. For example, when such terms are used to refer to a stated integer or group of integers, such terms do not imply the exclusion of any other integer or group of integers.

What is claimed is:

1. A radio frequency (RF) shield for use with a split magnetic resonance imaging (MRI) apparatus, comprising:
   a dielectric material layer;
   a first sheet attached to a first side of the dielectric material layer; and
   a second sheet attached to a second, different side of the dielectric material layer,
   where the first sheet includes a first set of axial cuts sized and positioned to reduce ohmic heating due to eddy currents induced in the RF shield by a split X-gradient coil in the split MRI apparatus in the split MRI apparatus,
   where the first sheet includes a first set of azimuthal cuts sized and positioned to reduce ohmic heating due to eddy currents induced in the RF shield by the split X-gradient coil,
   where the second sheet includes a second set of axial cuts sized and positioned to reduce ohmic heating due to eddy currents induced in the RF shield by a split Y-gradient coil in the split MRI apparatus,
   where the second sheet includes a second set of azimuthal cuts sized and positioned to reduce ohmic heating due to eddy currents induced in the RF shield by the split Y-gradient coil.

2. The RF shield of claim 1, where the first set of axial cuts and the first set of azimuthal cuts are positioned with respect to the second set of axial cuts and the second set of azimuthal cuts to account for rotating fields produced by quadrature operation of the split MRI system.

3. The RF shield of claim 1, where at least one of, a length, a width, and a position of a member of the first set of axial cuts, a member of the second set of axial cuts, a member of the first set of azimuthal cuts, and a member of the second set of azimuthal cuts are determined, at least in part, by eddy current pattern distributions on the first sheet and the second sheet.

4. A printed circuit board radio frequency (RF) shield for use with a split magnetic resonance imaging (MRI) apparatus having a split x-gradient coil, a split y-gradient coil, and an RF transmission coil, comprising:
   a dielectric material layer;
   a first metallic sheet attached to or in contact with a first side of the dielectric material layer; and
   a second metallic sheet attached to or in contact with a second, different side of the dielectric material layer,
   where the first metallic sheet includes a first set of axial cuts positioned in a region where an x-gradient coil eddy current induced in the printed circuit board RF shield by the split x-gradient coil exceeds an x-gradient coil threshold density level, and where an RF transmission coil eddy current induced in the printed circuit board RF shield by the RF transmission coil is less than a first RF transmission coil eddy current density level;
   where the first metallic sheet includes a first set of azimuthal cuts positioned in a region where the RF transmission coil eddy currents induced in the printed circuit board RF shield by the RF transmission coil are greater than a second RF transmission coil eddy current density level,
   where the second metallic sheet includes a second set of axial cuts positioned in a region where a y-gradient coil eddy current induced in the printed circuit board RF shield by the split y-gradient coil exceeds a y-gradient coil threshold density level, and where the RF transmission coil eddy current induced in the printed circuit board RF shield by the RF transmission coil are less than a third RF transmission coil eddy current density level, where the second metallic sheet includes a second set of azimuthal cuts positioned in a region where the RF transmission coil eddy current induced in the printed circuit board RF shield by the RF transmission coil is greater than a fourth RF transmission coil eddy current density level, where the first set of axial cuts and the first set of azimuthal cuts reduce ohmic heating due to the x-gradient coil eddy current without reducing RF shielding, and where the second set of axial cuts and the second set of azimuthal cuts reduce ohmic heating due to the y-gradient coil eddy current without reducing RF shielding.

5. The printed circuit board RF shield of claim 4, where the x-gradient coil eddy current has a density described by:

$$J_\phi(\phi, z) = \frac{\partial}{\partial z}S(\phi, z); J_z(\phi, z) = -\frac{1}{R_s}\frac{\partial}{\partial \phi}S(\phi, z)$$

where J is the eddy current density ($A/m^2$).

6. The printed circuit board RF shield of claim 4, where the y-gradient coil eddy current has a density described by:

$$J_\phi(\phi, z) = \frac{\partial}{\partial z}S(\phi, z); J_z(\phi, z) = -\frac{1}{R_s}\frac{\partial}{\partial \phi}S(\phi, z)$$

where J is the eddy current density ($A/m^2$).

7. The printed circuit board RF shield of claim 4, where the RF transmission coil eddy current has a density described by:

$$J_\phi(\phi, z) = \frac{\partial}{\partial z}S(\phi, z); J_z(\phi, z) = -\frac{1}{R_s}\frac{\partial}{\partial \phi}S(\phi, z)$$

where J is the eddy current density ($A/m^2$).

8. The printed circuit board RF shield of claim 4, where the printed circuit board RF shield is transparent to a gradient field produced by the split x-gradient coil and a gradient field produced by the split y-gradient coil, and where the printed circuit board RF shield is opaque to an RF field produced by the RF transmission coil.

9. The printed circuit board RF shield of claim 4, where one or more of the position, length, and width of a member of the first set of axial cuts is based, at least in part, on a first region domain [−Zc, +Zc].

10. The printed circuit board RF shield of claim 9, where the first region domain [−Zc, +Zc] is described by:

$$\int_0^\pi |J_z(\phi, z)|d\phi > \int_0^\pi |J_\phi(\phi, z)|d\phi \text{ for } z \in [-Zc, +Zc].$$

11. The printed circuit board RF shield of claim 4, where one or more members of the first set of azimuthal cuts or the second set of azimuthal cuts are located at positions corresponding to, at least in part, the region of minimal eddy current ohmic power on the printed circuit board RF shield.

12. The printed circuit board RF shield of claim 4, where one or more members of the first set of azimuthal cuts are located in a region corresponding to the minimal value of a power curve.

13. The printed circuit board RF shield of claim 4, where one or more members of the first set of azimuthal cuts or the second set of azimuthal cuts display azimuthal symmetry.

14. The printed circuit board RF shield of claim 4, where one or more members of the first set of azimuthal cuts or the second set of azimuthal cuts are offset to account for a rotating field produced by quadrature operation of the split MRI apparatus.

15. The printed circuit board RF shield of claim 4, where the region where the x-gradient coil eddy current exceeds an x-gradient coil threshold density level corresponds to a fingerprint eye of a split gradient coil employed in a split MRI system.

16. The printed circuit board RF shield of claim 4, where the region where the RF transmission coil eddy current is less than a first RF transmission coil eddy current density level corresponds to a fingerprint eye of a split gradient coil employed in a split MRI system.

17. The printed circuit board RF shield of claim 4, where the region where the y-gradient coil eddy current exceeds a y-gradient coil threshold density level corresponds to a fingerprint eye of a split gradient coil employed in a split MRI system.

18. The printed circuit board RF shield of claim 4, where the region where the RF transmission coil eddy current is less than a third RF transmission coil eddy current density level corresponds to a fingerprint eye of a split gradient coil employed in a split MRI system.

19. The printed circuit board RF shield of claim 4, where one or more members of the first set of axial cuts is spanned by a capacitor.

20. The printed circuit board RF shield of claim 4, where one or more members of the first set of azimuthal cuts is spanned by a capacitor.

21. The printed circuit board RF shield of claim 4, where one or more members of the second set of axial cuts is spanned by a capacitor.

22. The printed circuit board RF shield of claim 4, where one or more members of the second set of azimuthal cuts is spanned by a capacitor.

23. A radio frequency (RF) shield for use with a split magnetic resonance imaging (MRI) apparatus, comprising:
a dielectric material layer;
a first sheet attached to a first side of the dielectric material layer; and
a second sheet attached to a second, different side of the dielectric material layer,
where the first sheet includes a first set of axial cuts and a first set of azimuthal cuts, and
where the second sheet includes a second set of axial cuts and a second set of azimuthal cuts.

* * * * *

UNITED STATES PATENT AND TRADEMARK OFFICE
CERTIFICATE OF CORRECTION

PATENT NO. : 10,557,902 B2  
APPLICATION NO. : 14/685021  
DATED : February 11, 2020  
INVENTOR(S) : Robert W. Brown et al.

Page 1 of 1

It is certified that error appears in the above-identified patent and that said Letters Patent is hereby corrected as shown below:

On the Title Page

Item (73) Assignees:
Add "ViewRay Technologies, Inc., Oakwood, OH (US)" as an Assignee.

Signed and Sealed this
Sixteenth Day of June, 2020

Andrei Iancu
*Director of the United States Patent and Trademark Office*